United States Patent
Ishii et al.

(10) Patent No.: US 8,678,062 B2
(45) Date of Patent: Mar. 25, 2014

(54) ADHESIVE TAPE JOINING APPARATUS

(75) Inventors: Naoki Ishii, Kameyama (JP); Masayuki Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 597 days.

(21) Appl. No.: 12/893,241

(22) Filed: Sep. 29, 2010

(65) Prior Publication Data
US 2011/0079357 A1 Apr. 7, 2011

(30) Foreign Application Priority Data
Oct. 1, 2009 (JP) ................................ 2009-229683

(51) Int. Cl.
*B32B 37/00* (2006.01)
*B32B 38/00* (2006.01)
*B32B 38/04* (2006.01)

(52) U.S. Cl.
USPC ............ 156/522; 156/510; 156/516; 156/523

(58) Field of Classification Search
USPC ........... 156/510, 516, 522, 523; 29/33, 564.6, 29/564.7; 280/652–655; 242/533–533.8
See application file for complete search history.

(56) References Cited

U.S. PATENT DOCUMENTS

| | | | |
|---|---|---|---|
| 6,056,232 A * | 5/2000 | Karaki et al. .............. | 242/559.3 |
| 6,249,943 B1 | 6/2001 | Matsushita et al. | |
| 7,380,745 B2 * | 6/2008 | Narita et al. ............... | 242/530.1 |
| 7,540,178 B2 * | 6/2009 | Peter et al. ..................... | 72/11.8 |
| 2006/0138273 A1 * | 6/2006 | Reinke ........................ | 242/559.4 |
| 2007/0131344 A1 | 6/2007 | Tsujimoto et al. | |
| 2007/0181245 A1 * | 8/2007 | Kaneshima et al. .......... | 156/229 |
| 2009/0211710 A1 | 8/2009 | Yamamoto et al. | |

FOREIGN PATENT DOCUMENTS

| | | |
|---|---|---|
| CN | 1868038 A | 11/2006 |
| CN | 101521173 A | 9/2009 |
| JP | 3888754 B2 | 12/2006 |
| TW | 418458 | 1/2001 |

* cited by examiner

*Primary Examiner* — Mark A Osele
*Assistant Examiner* — Christopher C Caillouet
(74) *Attorney, Agent, or Firm* — Cheng Law Group, PLLC

(57) ABSTRACT

A collection bobbin is provided on a vertical line that travels a center of a supply bobbin. A pair of connection mechanisms is provided at front both sides of a tape housing chamber. An adhesive tape transport carriage with connection portions at a forward end of a carriage frame is connected to the connection mechanisms in the apparatus body. Loading of a master roll of an adhesive tape to the supply bobbin and unloading of a roll of a residual cut tape may be performed at the same position.

12 Claims, 16 Drawing Sheets

ADHESIVE TAPE JOINING APPARATUS

BACKGROUND OF THE INVENTION

1. Field of the Invention

This invention relates to an adhesive tape joining apparatus that joins an adhesive tape to a semiconductor wafer and a ring frame, or to a semiconductor wafer. In particular, this invention relates to a technique of loading and unloading the adhesive tape to and from the apparatus.

2. Description of the Related Art

One conventional adhesive tape joining apparatus has a tape supply mechanism and a tape collecting section arranged in parallel above or below a holding table for supplying an adhesive tape to a semiconductor wafer and a ring frame that are held on the holding table or to only the semiconductor wafer held on the holding table. For instance, a master roll of the adhesive tape and a winding section that winds up a residual tape cut in a wafer shape are arranged in parallel so as to sandwich the holding table. Moreover, another conventional adhesive tape joining apparatus has a master roll of a carrier tape to which a precut adhesive tape cut in advance in a semiconductor wafer shape is joined and held with a given pitch and a roll that collects the carrier tape after separating the precut adhesive tape so as to sandwich a holding table. See Japanese Patent No. 3888754.

However, the conventional adhesive tape joining apparatus have the following drawbacks.

Specifically, a semiconductor wafer tends to have a larger diameter and a reduced thickness due to high density packing in recent years. In order to meet this requirement, a surface-protective adhesive tape or dicing tape has a larger width. In addition, the adhesive tape and the dicing tape have an increased thickness to give rigidity to the wafer. Moreover, the adhesive tape and the dicing tape need to have a sufficient length for reducing replacement frequency of the roll to an apparatus body to improve working efficiency.

Consequently, the master roll with the wound adhesive tape tends to be larger in size and weight. Accordingly, it is difficult to manually load the master roll, the roll of the residual tape, and the roll of the carrier tape, etc., to and from the apparatus.

SUMMARY OF THE INVENTION

This invention has one object to provide adhesive tape joining apparatus that readily allows to load a master roll such as an adhesive tape in larger size to the apparatus and to unload a roll of a residual tape or a carrier tape from the apparatus.

Additional features of the invention will be set forth in the description which follows, and in part will be apparent from the description, or may be learned by practice of the invention.

This invention discloses adhesive tape joining apparatus that joins an adhesive tape to a semiconductor wafer. The apparatus includes a holding table, a tape supply mechanism, a tape joining mechanism, a tape cutting mechanism, a tape collecting section, and a connection mechanism. The holding table holds the semiconductor wafer. The tape supply mechanism supplies the strip adhesive tape wound about an original roll to the semiconductor wafer. The tape joining mechanism joins the adhesive tape to the semiconductor wafer. The tape cutting mechanism cuts the adhesive tape along a contour of the semiconductor wafer. The tape collecting section having a winding shaft traveling a center of the master roll set in the tape supply mechanism in a vertical line winds up and collects a residual cut tape into a roll shape. The connection mechanism guides to a tape set position an adhesive tape transport carriage that loads the original roll to the tape supply mechanism and unloads the roll of the residual cut tape from the tape collecting section, and positions the adhesive tape transport carriage for connection thereof.

This invention further discloses adhesive tape joining apparatus that joins an adhesive tape to a semiconductor wafer. The apparatus includes a holding table, a tape supply mechanism, a tape joining mechanism, a tape collecting section, and a connection mechanism. The holding table holds the semiconductor wafer. The tape supply mechanism supplies from a master roll to the semiconductor wafer a strip carrier tape with a precut adhesive tape cut in advance in the semiconductor shape being joined and held with a given pitch. The tape joining mechanism joins the adhesive tape to the semiconductor wafer while separating the adhesive tape by folding back the carrier tape with an edge member. The tape collecting section having a winding shaft traveling a center of the master roll set in the tape supply mechanism in a vertical line winds up and collects the carrier tape separated with a separation member into a roll shape. The connection mechanism guides to a tape set position an adhesive tape transport carriage that loads the original roll to the tape supply mechanism and unloads the roll of the carrier tape from the tape collecting section, and positions the adhesive tape transport carriage for connection thereof.

This invention further discloses adhesive tape joining apparatus that joins a supporting adhesive tape to a ring frame and a semiconductor wafer for integration therewith. The apparatus includes a work piece holding mechanism, a tape supply mechanism, a tape joining unit, a tape cutting mechanism, a tape collecting section, and a connection mechanism. The work piece holding mechanism holds each of the ring frame and the semiconductor wafer in a given attitude. The tape supply mechanism supplies a carrier tape with a precut adhesive tape cut in advance in the ring frame being joined and held or a strip adhesive tape to a rear face of the ring frame that is held on the work piece holding mechanism. The tape joining unit joins the adhesive tape to the ring frame and the semiconductor wafer held on the work piece holding mechanism by a joining roller that rolls while pressing the precut adhesive tape that is folded back with the separation member and fed out from the carrier tape or the strip adhesive tape. The tape cutting mechanism cuts the strip adhesive tape along a contour of the ring frame. The tape collecting section having a winding shaft traveling a center of the master roll set in the tape supply mechanism in a vertical line winds up and collects the residual tape or the carrier tape subject to a cutting process. The connection mechanism guides to a tape set position an adhesive tape transport carriage that loads the original roll to the tape supply mechanism and unloads the roll of the residual tape or the carrier tape from the tape collecting section, and positions the adhesive tape transport carriage for connection thereof.

According to the adhesive tape joining apparatus in each of the foregoing embodiments, the master roll of the adhesive tape to be fed to the tape supply mechanism and the roll of the residual tape or the carrier tape to be collected into the tape collecting section are arranged so as to align along a vertical line traveling the center of the master roll. Consequently, both rolls may be replaced in the same position where the adhesive tape transport carriage is connected to the apparatus body.

Moreover, with the configuration of the foregoing embodiments, the adhesive tape transport carriage preferably includes a caster on a bottom face of a carriage frame, a lifting movable table that lifts along an axis that is erected on the carriage frame, and a holding table that mounts and holds the roll and moves horizontally with respect to the carriage frame.

According to the configuration, lifting of the movable table allows the holding table to align in a loading position of the master roll and in an unloading position of the carrier tape or the residual tape. In addition, horizontal movement of the holding table with respect to the carriage frame readily allows the master roll to be loaded to the tape supply mechanism and the roll of the carrier tape or residual tape to be unloaded from the tape collecting section.

Furthermore, the foregoing configuration preferably includes a sensor that detects a connection state of the adhesive tape transport carriage.

The foregoing configuration may perform proper alignment for unloading the master roll and unloading the carrier tape or the residual tape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE PREFERRED EMBODIMENTS

Figure 1:
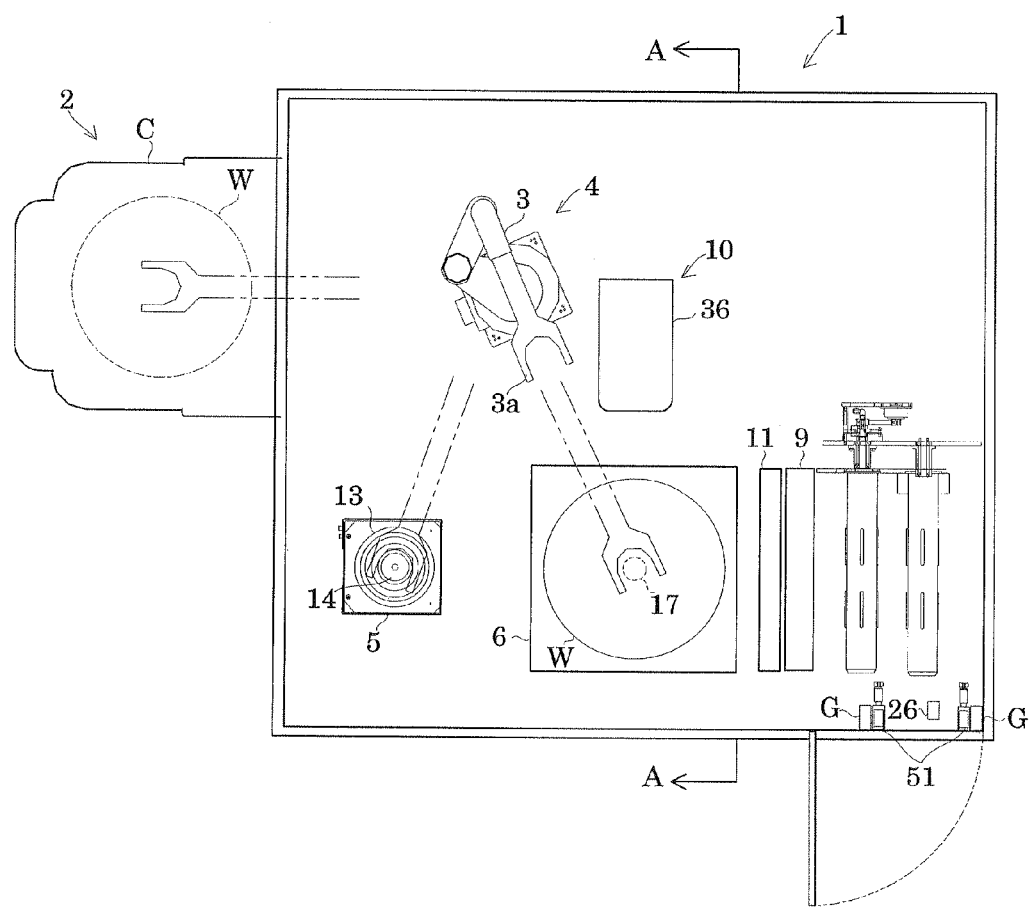
FIG. 1 is a plan view of an adhesive tape joining apparatus according to Embodiment 1.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

One exemplary embodiment of adhesive tape joining apparatus according to this invention will be described in detail hereinafter with reference to the drawings. Here in the apparatus of this embodiment, description will be given to a case as one example where a protective adhesive tape is joined to a surface of a semiconductor wafer.

Embodiment 1

Figure 2:
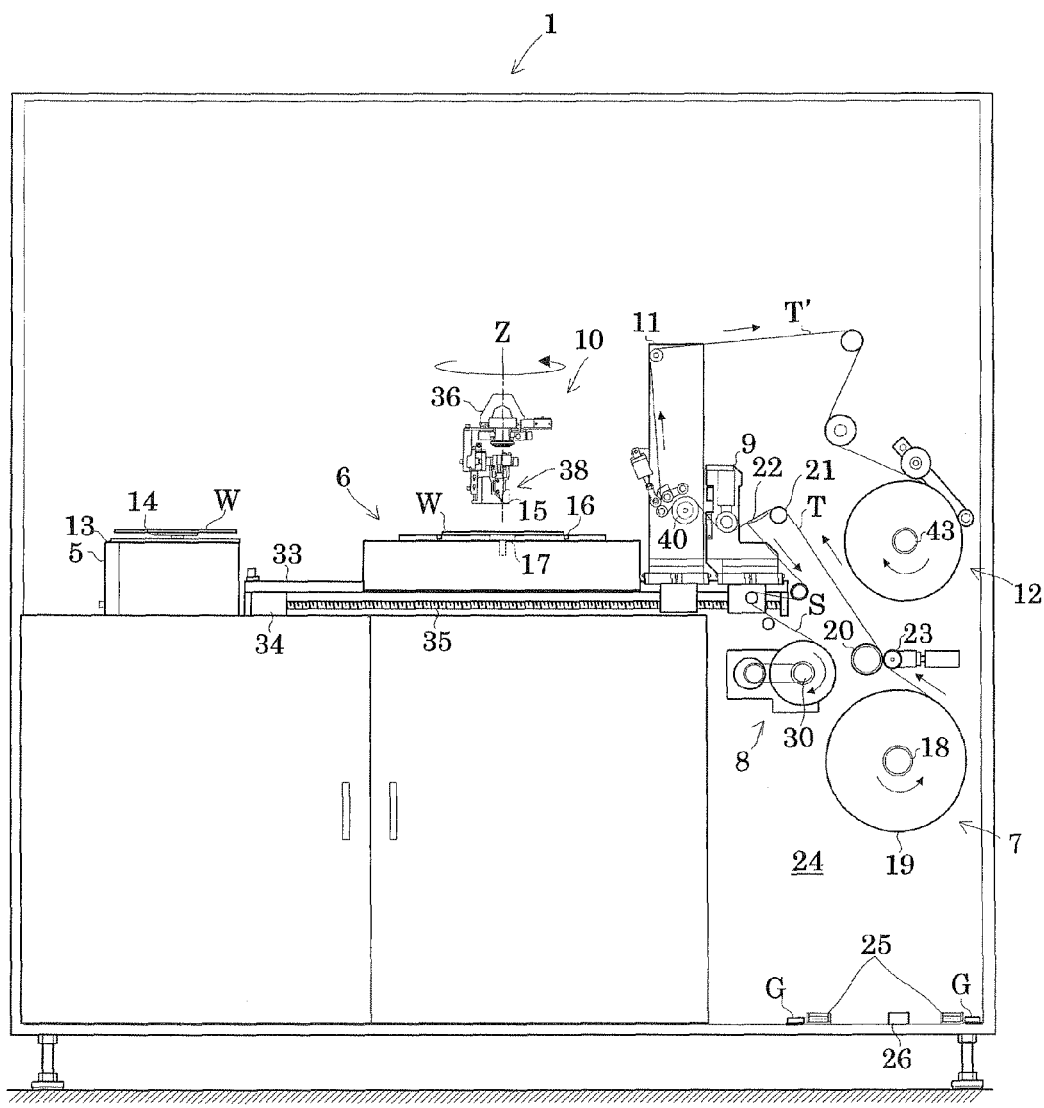
FIG. 2 is a front view of the adhesive tape joining apparatus.

As shown in FIGS. 1 and 2, adhesive tape joining apparatus 1 includes a wafer supply/collection section 2, a wafer transport mechanism 4 with a robot arm 3, an alignment stage 5, a chuck table 6, a tape supply mechanism 7, a separator collecting section 8, a joining unit 9, a tape cutting mechanism 10, a separation unit 11, and a tape collecting section 12. The wafer supply/collection section 2 has a cassette C mounted therein that houses a semiconductor wafer W (hereinafter, simply referred to as a "wafer W") subject to a back grinding process in a stack manner. The alignment stage 5 aligns the wafer W. The chuck table 6 suction-holds the aligned wafer W placed thereon. The tape supply mechanism 7 supplies a surface-protective adhesive tape T with a separator S onto a position above the wafer W that is suction-held on the chuck table 6. The separator collecting section 8 collects the separator S separated from the adhesive tape T that is supplied from the tape supply mechanism 7. The joining unit 9 joins the adhesive tape T to the wafer W placed on and suction-held by the chuck table 6. The tape cutting mechanism 10 cuts out the adhesive tape T along a contour of the wafer W. The separation unit 11 separates a residual cut tape T'. The tape collecting section 12 winds and collects the residual tape T'. Next, each component will be described in detail.

The wafer supply/collecting section 2 includes a cassette table. The wafer W has a pattern surface (hereinafter appropriately referred to as a "surface") with the adhesive tape T joined thereto. The cassette C with the wafers W housed therein in a stack manner is placed on the cassette table. Here, each of the wafers W is kept in a horizontal attitude with the pattern surface thereof directed upward.

Figure 3:
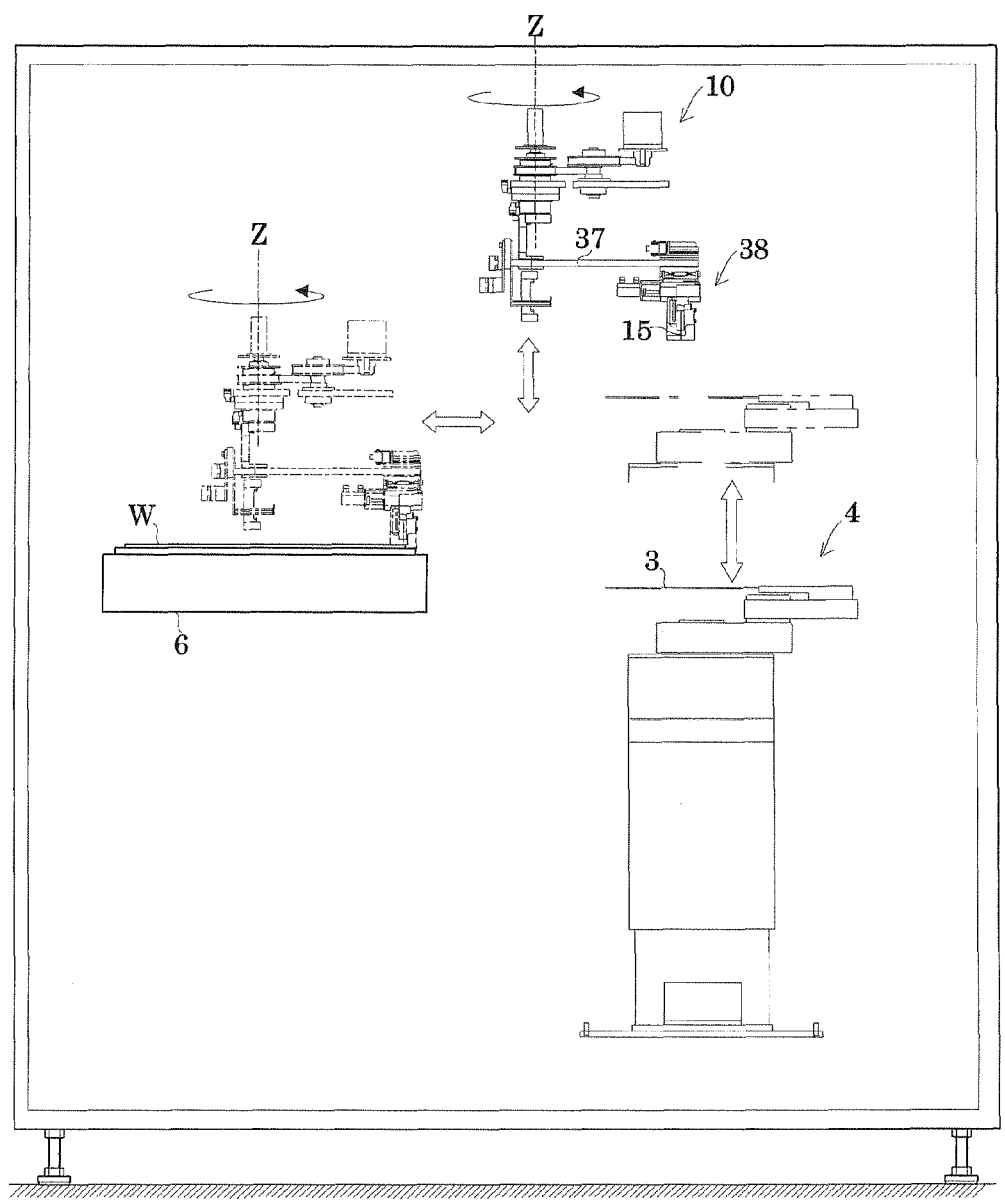
FIG. 3 is a sectional view on arrow A-A in FIG. 1.

As shown in FIGS. 1 and 3, the wafer transport mechanism 4 turns and moves vertically with a drive mechanism. The robot arm 3 in the wafer transport mechanism 4 has at its tip end a wafer holder 3a of a vacuum-suction type in a horseshoe shape. Here, the wafer holder 3a has a suction hole to perform vacuum suction on a rear face of the wafer W.

That is, the robot arm 3 suction-holds the rear face (lower surface) of the wafer W by inserting the wafer holder 3a between the stacked wafers W housed in the cassette C. Moreover, the robot arm 3 pulls out the suction-held wafer W from the cassette C, and transports the wafer W to the alignment stage 5, the chuck table 6, and the original cassette C, in turn.

As shown in FIGS. 1 and 3, the alignment stage 5 has a suction holder 14. The suction holder 14 protrudes and retracts at a center of a holding table 13 for transporting the wafer W to and from each other. The alignment stage 5 performs alignment of the wafer W that is placed on the holding table 13 based on an orientation mark or a notch formed at an outer periphery of the wafer W. The alignment stage 5 covers the entire rear face of the wafer W for performing vacuum suction to the holding table 13.

When the wafer transport mechanism 4 transports the wafer W from the robot arm 3 and places the wafer W on the chuck table 6 in a predetermined alignment attitude, the chuck table 6 sucks by vacuum the wafer W. As shown in FIG. 2, moreover, a cutter traveling groove 16 is formed on a top face of the chuck table 6. The cutter traveling groove 16 allows a cutter blade 15 of the tape cutting mechanism 10 to turn along the contour of the wafer W and to cut the adhesive tape T. In addition, a suction holder 17 is provided at a center of the holding table that protrudes and retracts in loading and unloading of the wafer.

The tape supply mechanism 7 guides and winds the adhesive tape T with the separator S that is fed from a master roll 19 set in the supply bobbin 18 to a feed roller 20 and a guide roller 21, and guides the adhesive tape T toward a separation member 22 formed as an edge of a knife. Then, the separator S is separated from the adhesive tape T by folding back the adhesive tape T with a tip end of the separation member 22. The adhesive tape T with the separator S separated therefrom is guided toward the joining unit 9. The feed roller 20 guides to pinch the adhesive tape T in cooperation with a pinch roller 23, and is rotated by a motor.

Figure 4:
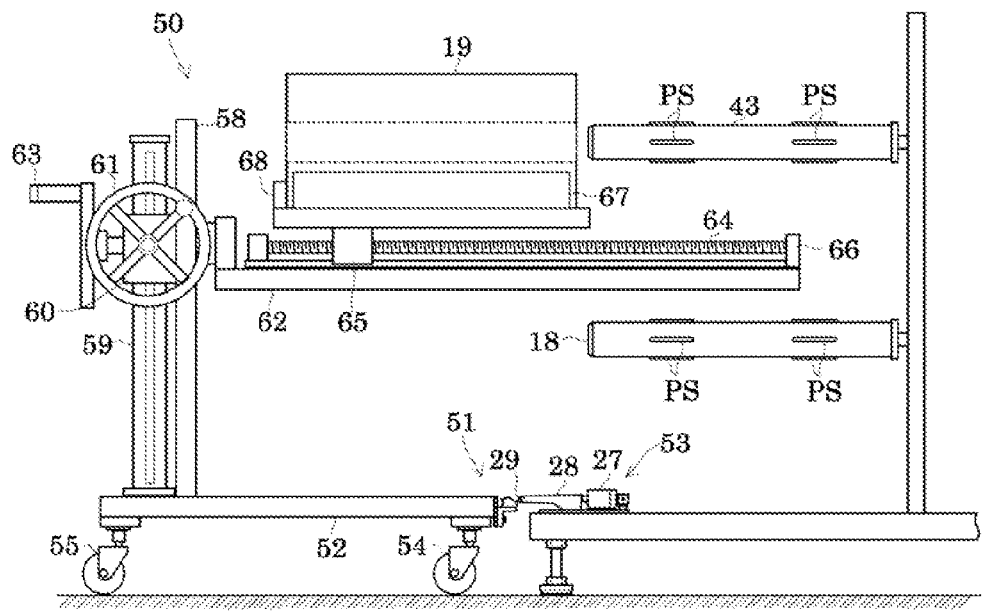
FIG. 4 is a side view of an adhesive tape transport carriage.

As shown in FIG. 4, the supply bobbin 18 has pushers PS arranged at an equal interval along a circumferential surface on a tip end and a proximal end in a longitudinal direction that project and retract therefrom. Here, the supply bobbin 18 is applied with appropriate resistance against its rotation in order to prevent the adhesive tape T from being fed out excessively.

Moreover, the tape supply mechanism 7 has a guide G, a pair of connection mechanisms 25, and a positioning sensor 26 on the front both sides below a tape housing chamber 24 (see FIG. 2) that feeds the adhesive tape T to the supply bobbin 18. The guide G positions and guides an adhesive tape transport carriage 50 (hereinafter appropriately referred to as a "carriage 50"). The pair of connection mechanisms 25 each engages a pair of connection portions 51 that are arranged in a width direction at a forward end of the carriage 50.

Figure 10:
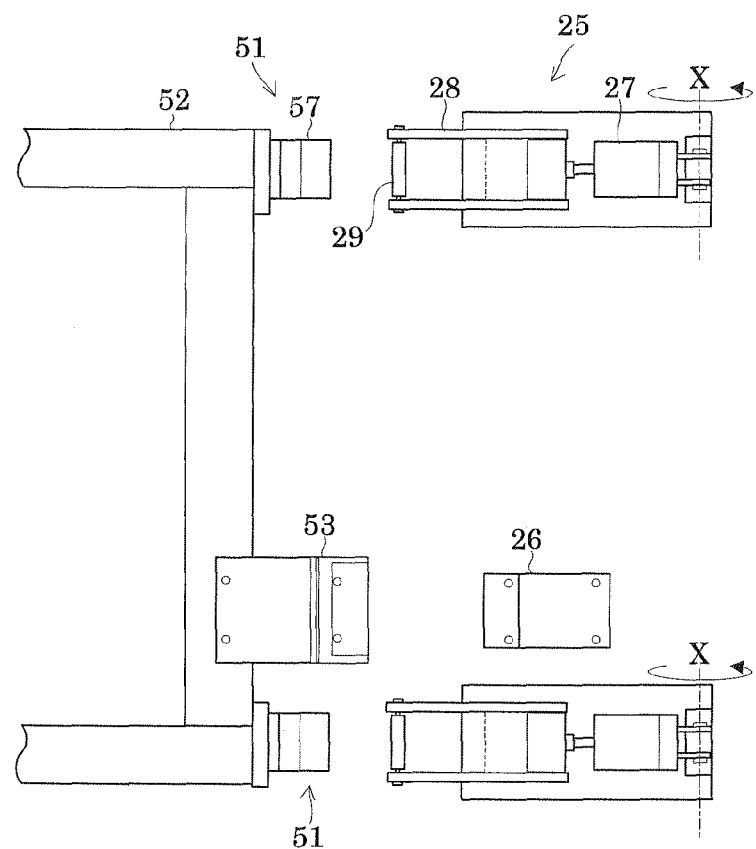
FIG. 10 is a plan view showing a connection portion of the adhesive tape transport carriage to the apparatus body.
Figure 11:
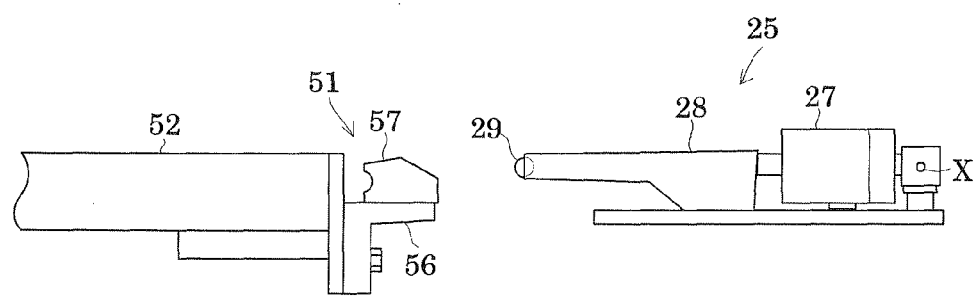
FIG. 11 is a side view showing the connection portion of the adhesive tape transport carriage to the apparatus body.
Figure 12:
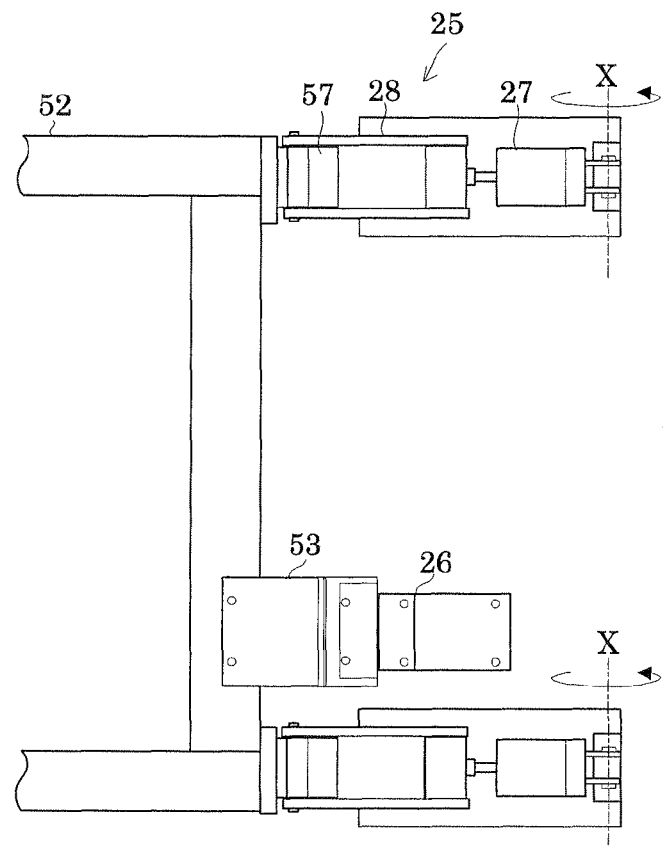
FIG. 12 is a plan view showing a connection state of the adhesive tape transport carriage to the apparatus body.

As shown in FIGS. 10 to 12, the connection mechanism 25 has an engagement portion at a tip end of a rod in an air cylinder 27 capable of swinging about a horizontal axis X in a rearward position in the apparatus body. The engagement portion is formed of a bifurcate frame 28 and an engagement roller 29 supported at a front end thereof so as to freely rotate.

The air cylinder 27 turns ON a switch provided in the apparatus body or an operation panel, thereby drawing the engaged adhesive tape transport carriage 50 into the apparatus body.

In this embodiment, the sensor 26 is of contact type that determines a position through contact to a positioning portion 53. The positioning portion 53 is provided at a forward end of the carriage frame in the adhesive tape transport carriage 50, mentioned later. Here, the sensor 26 is not limited to a contact type, and just needs to determine the position from the adhesive tape transport carriage 50. The sensor 26 may be a non-contact optical camera or an optical sensor.

As shown in FIG. 4, the adhesive tape transport carriage 50 has a pair of wheels 54 on both sides on a front bottom of the carriage frame 52 and a pair of casters 55 on both sides on a back bottom of the carriage frame 52.

The pair of connecting portions 51 and the positioning portion 53 is provided in a width direction at a forward end of the carriage frame 52. As shown in FIG. 11, the connecting portions 51 have a tapered engagement block 57 directed upward. The engagement block 57 is mounted on a bracket 56 provided at the forward end of the carriage frame 52 so as to have a given distance from the forward end of the carriage frame 52. The engagement block 57 has a groove on a rear inner surface thereof that is depressed and bent. The engagement roller 29 is formed so as to engage the groove. Specifically, the engagement roller 29 in the apparatus body rolls on the engagement block 57, thereby swinging and lifting the air cylinder 27. Upon climbing over the engagement block 57, the engagement roller 29 falls. In addition, the air cylinder 27 operates to draw the engagement roller 29 into the groove, thereby ensuring engagement of the engagement roller 29 into the groove of the engagement block 57. With this configuration, positioning and connection are performed of the carriage 50 and the apparatus body.

The positioning portion 53 confirms alignment by contacting to the sensor 26 in the apparatus body when the carriage 50 is set into the tape housing chamber 24.

As shown in FIG. 4, the carriage has a handle 58 at a rearward position thereof. The carriage 50 is pushed by hand to move with the handle 58.

In addition, the carriage 50 has a lifting movable table 60 at a rearward position thereof. The lifting movable table 60 is movable vertically along an erected guide shaft 59. Specifically, rotation of an operation handle 61 allows the lifting movable table 60 to move upward and downward in cooperation with a pinion in the lifting movable table that is interlocked with a rack formed in the guide shaft 59. The lifting movable table 60 has a stopper so as to stop the movable table 60 in any level.

The lifting movable table 60 has a holding table 62 mounted thereon. The holding table 62 has a longer length than the longitudinal length of the carriage frame 52. The holding table 62 is formed such that the front end of the holding table 62 pushes out toward the tape housing chamber 24 when the carriage 50 connects the apparatus body. A horizontal movable table 65 is provided on the holding table 62. The horizontal movable table 65 drives in a screw feed manner along a ball shaft 64 by rotation of a operation handle 63 provided in the lifting movable table 60. A stopper 66 is provided at a front end of the holding table 62. The stopper 66 represents a position where setting is completed of the master roll to the supply bobbin 18. The stopper 66 avoids falling of the holding table 62.

Figure 5:
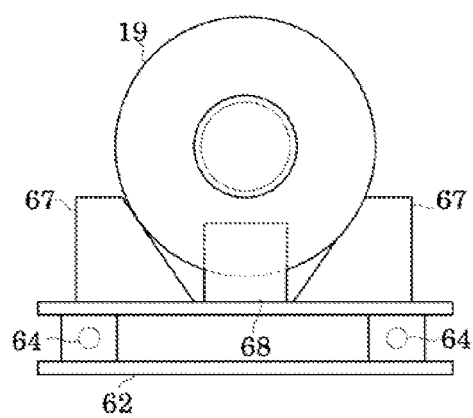
FIG. 5 is a front view of a holding table provided in the adhesive tape transport carriage.

As shown in FIG. 5, a pair of holding blocks 67 is provided on both sides in a width direction of the holding table 62. The pair of holding blocks 67 holds the master roll 19. Moreover, both the holding blocks 67 are tapered inwardly and obliquely downward to face to each other. In addition, a pressing member 68 is provided in a rearward position of the holding table 62 to press the master roll 19 toward the supply bobbin 18.

Returning to FIG. 2, the separator collecting section 8 has a collection bobbin 30 that winds up the separator S separated from the adhesive tape T. The collection bobbin 30 appropriately winds up the separator S, or reversely drives to feed out the separator S.

Figure 6:
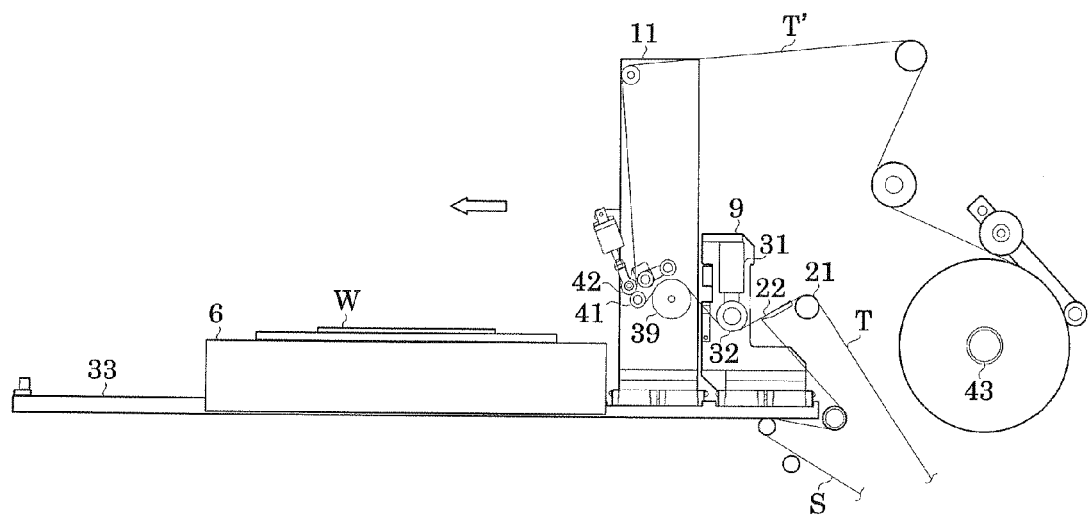
FIGS. 6 to 9 each shows an operation of joining an adhesive tape in the apparatus of Embodiment 1.

The joining unit 9 has a joining roller 32 shown in FIG. 6. The joining roller 32 moves upward and downward by an air cylinder 31. Moreover, as shown in FIG. 2, the joining unit 9 is entirely supported so as to move horizontally along a guide rail 33, and reciprocate in a screw feed manner with a screw shaft 35 that rotates backward and forward by a motor 34.

As shown in FIGS. 2 and 3, the tape cutting mechanism 10 has a movable table 36. The movable table 36 may move vertically and horizontally between a standby position on a rear side above the chuck table 6 and a cutting operation position above the chuck table 6. A support arm 37 is provided under the movable table 36 so as to turn about a vertical axis Z at a center of the chuck table 6. Moreover, the cutter blade 15 is mounted on a cutter unit 38 on a free end of the support arm 37 with a tip end thereof directed downward. When the support arm 37 turns about the vertical axis Z, the cutter blade 15 travels along the contour of the wafer W to cut out the adhesive tape T into the wafer shape.

As shown in FIGS. 2 and 6, the separation unit 11 has a separation roller 39, a feed roller 41 driven by a motor 40, and a pinch roller 42 for pinching the adhesive tape. Moreover, the separation unit is entirely supported so as to move horizontally along the guide rail 33, and reciprocate in a screw feed manner with the screw shaft 35 that rotates backward and forward by the motor 34.

The tape collecting section 12 has a collection bobbin 43 that is driven by a motor. The collection bobbin 43 is driven so as to rotate in a direction of winding up the residual cut tape T'. As shown in FIG. 4, the collection bobbin 43 has pushers PS arranged at an equal interval along a circumferential surface on a tip end and a proximal end in a longitudinal direction that project and retract therefrom. Here in this embodiment, as shown in FIG. 2, the collection bobbin 43 is arranged such that an axis thereof is located above in a vertical line of the axis of the supply bobbin 18. The collection bobbin 43 has the axis with the same level as a surface of the chuck table 6. That is, the collection bobbin 43 and the supply bobbin 18 are arranged vertically in a vertical line within a level no more than one-half of that of the apparatus body.

Next, with reference to FIGS. 6 to 9, description will be given of a series of basic operations for joining the surface-protective adhesive tape T to the surface of the wafer W using the apparatus in the foregoing embodiment.

A joining command is issued, and then the robot arm 3 in the wafer transport mechanism 4 moves towards the cassette C placed on the cassette table. The wafer holder 3a is inserted between the wafers housed in the cassette C. The wafer holder 3a suction-holds the rear face of the wafer W for unloading. The robot arm 3 moves and places the unloaded wafer W to the alignment stage 5.

The alignment stage 5 moves upward the suction holder 14 to suction-hold the rear face of the wafer W. The alignment stage 5 performs alignment of the wafer W based on the notch or the orientation mark formed at the outer periphery of the wafer W. The robot arm 3 then transfers the aligned wafer W from the alignment stage 5 to the chuck table 6, and places the wafer W on the chuck table 6. Here, as shown in FIG. 6, the joining unit 9 and the separation unit 11 are on standby in an original position on the right side. The tape cutting mechanism 10 and the cutter blade 15 are on standby in an original position on the upper rear side.

When the wafer W is transported above the chuck table 6, the suction holder 17 projects and moves upward from the center of the chuck table 6 to suction-hold the rear face of the wafer W. Simultaneously, the wafer holder 3a of the robot arm 3 releases suction holding, and retracts. Thereafter, the suction holder 17 retracts and moves downward to place the wafer W on the chuck table 6. Thus, loading of the wafer W is completed.

Figure 7:
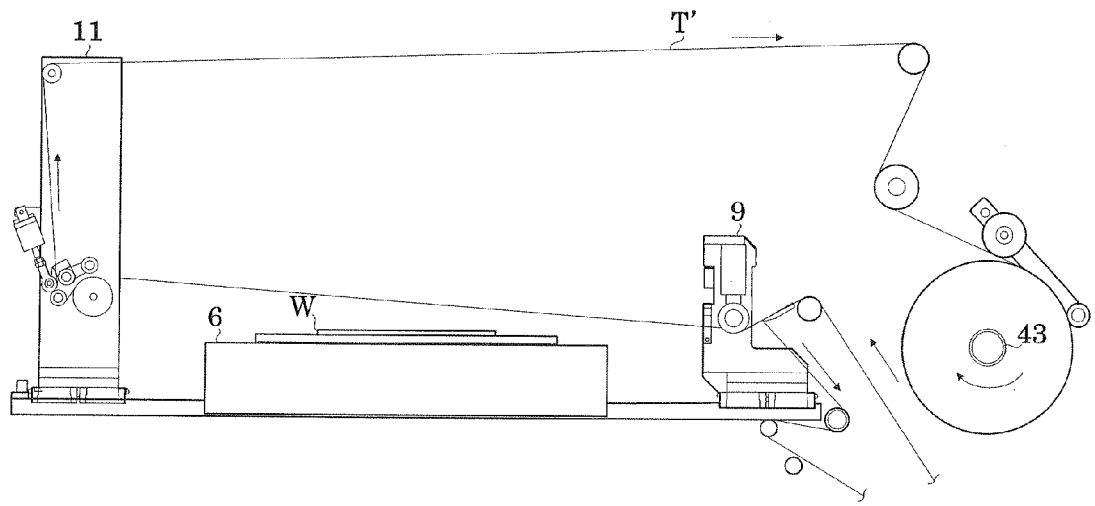

Upon completion of loading the wafer W, the separation unit 11 moves to the left to feed out the adhesive tape T from the master roll 19, and the collection bobbin 43 rotates reversely to pull out the residual tape T, which is shown in FIG. 7. Here, the feed roller 20 drives under a state where the motor stops driving and the pinch roller 23 pinches the adhesive tape T with pinch roller 23 on the feed roller 20. That is, the adhesive tape T is fed in a tape supply direction. As a result, a proper tension is applied to the adhesive tape T above the wafer W.

Figure 8:
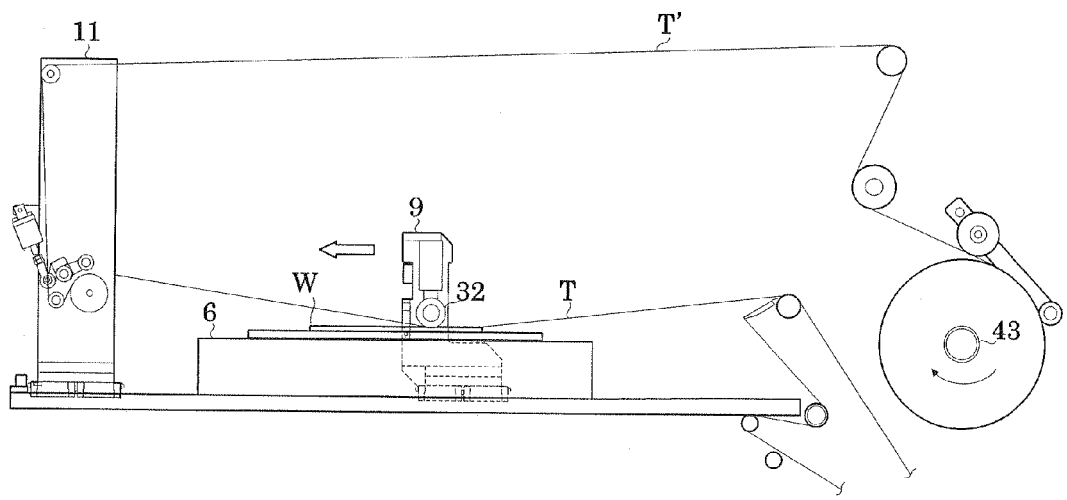

Next, the process proceeds to a tape joining process. Specifically, as shown in FIG. 8, the joining roller 32 moves downward, and the joining unit 9 rolls forward (to the left in the drawing) while moving forward and pressing the adhesive tape T against the wafer W with the joining roller 32. Consequently, the adhesive tape T is to be joined to the surface of the wafer W.

Figure 9:
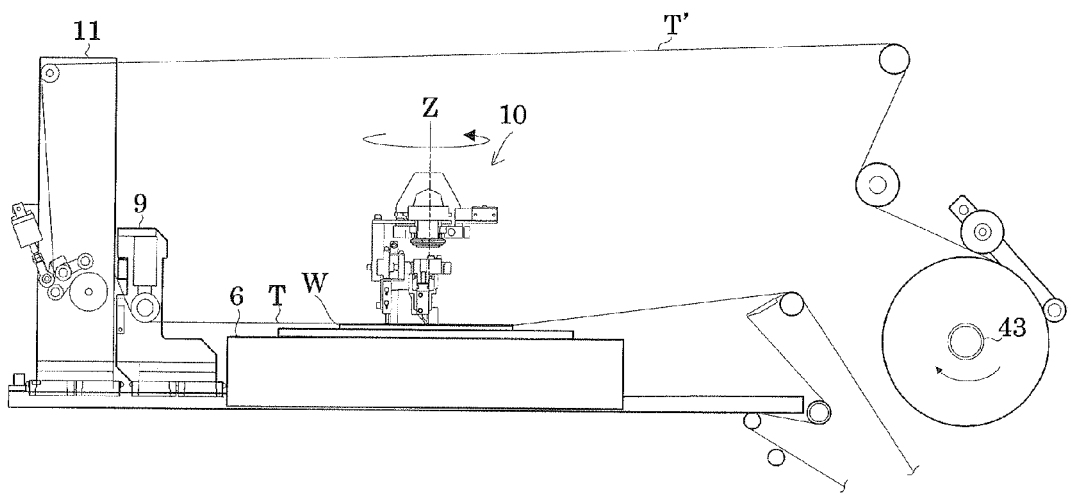

As shown in FIG. 9, when the joining unit 9 moves over the chuck table 6 to reach a joining termination position on the wafer W, the tape cutting mechanism 10 on standby on the upper rear side operates. That is, the cutter blade 15 moves to a cutting operation position. The cutter blade 15 moves downward on the cutter traveling groove on the chuck table 6 to pierce the adhesive tape T.

Next, the support arm 37 turns in a given direction, whereby the cutter blade 15 turns about the vertical axis Z to cut the adhesive tape T along the contour of the wafer W.

Upon completion of cutting the adhesive tape, the cutter blade 15 moves upward to return to its standby position on the upper rear side of the apparatus. Thereafter, each of the joining unit 9 and the separation unit 11 moves to its original position, whereby the residual tape T' with the wafer shaped adhesive tape cut out from the adhesive tape T is separated and wound to the collection bobbin 43. That is, each of the joining unit 9 and the separation unit 11 returns to its original position shown in FIG. 6.

When the above tape joining operation is completed, the chuck table 6 releases the suction holding of the wafer W. Then, the suction holder 14 holds the wafer W to move above the holding table. Here, the wafer W is moved and placed on the wafer holder 3a of the robot arm 3 for unloading. The wafer W is inserted into the cassette C in the wafer supply/collecting section 2.

Thus, one adhesive tape joining process is completed as described above. Thereafter, the foregoing operation is to be repeatedly performed in succession.

Next, description will be given of an operation to load the master roll 19 of the adhesive tape T to the apparatus body and unload the roll out of the residual tape T.

The lifting movable table 60 is controlled as to be above the collection bobbin 43 by the operation handle 61 in the adhesive tape transport carriage 50, thereby placing the master roll 19 on the holding table 62.

Figure 13:
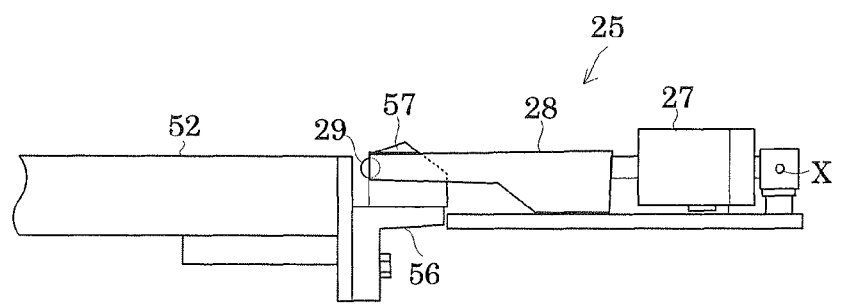
FIG. 13 is a side view showing the connection state of the adhesive tape transport carriage to the apparatus body.

As shown in FIGS. 10 and 11, the carriage 50 moves toward the connection mechanism 25 of the tape housing chamber 24 in the apparatus body. The guide G positions the carriage 50 in a width direction at the time when the carriage 50 reaches the front end of the tape housing chamber 24. Pushing the carriage 50 with this state allows the engagement roller 29 to climb over the engagement block 57 with the air cylinder 27 in the connection mechanism 25 extending. Here, the sensor 26 operates to detect a position of the carriage 50. As a result of the detection, when the connection position is correct, the apparatus body makes an informing sound or lights up a lamp to inform an operator. When confirming the informing sound, etc., the operator operates the switch in the apparatus body to operate the air cylinder 27 (ON). The air cylinder 27 draws the engagement roller 29 toward the apparatus body to engage the carriage 50 with the apparatus body, as shown in FIGS. 12 and 13. The sensor 26 detects completion of the connection, and the apparatus body makes the informing sound or lights up the lamp to inform the operator.

Upon confirmation of the completed connection, the operator operates the operation handle 61 to control a level of the holding table 62 such that the axis of the supply bobbin 18 approximately conforms to the axis of the master roll 19. Here, the pushers PS retract within the supply bobbin 18.

Upon completion of controlling the level, the operation handle 63 is operated to move forward the holding table 62. Here, the pressing member 68 behind the holding table 62 presses the master roll 19 to the supply bobbin 18.

The pushers PS project when the horizontal movable table 65 contacts the stopper 66 to hold the master roll 19 with the supply bobbin 18.

The operation handle 61 is operated to move slightly downward the holding table 62 and release the contact of the holding block 67 and the master roll 19. Thereafter, the operation handle 63 rotates reversely. That is, the holding table 62 moves backward. As noted above, setting of the master roll 19 to the supply bobbin 18 is completed.

Next, the air cylinder 27 is turned OFF to release drawing of the engagement roller 29. Here, the carriage 50 moves backward to release the connection to the apparatus body.

The operation handle 61 is operated to control a level of the holding table 62 such that a holding surface of the holding block 67 is below the roll of the residual tape T' wounded and collected into the collection bobbin 43 in a position where the carriage 50 retracts. Upon completion of the control, the carriage 50 moves again toward the tape housing chamber 24 in the apparatus body. Connecting is to be repeatedly performed that is same as that in loading the master roll 19.

When connection of the carriage 50 and the apparatus body is completed, the operation handle 63 is operated to move forward the holding table 62. When the horizontal movable table 65 contacts the stopper 66, the operation handle 61 is operated to move the lifting movable table 60 upward, thereby pressing the holding block 67 against the residual tape T' on the lower side.

Here, the pushers PS of the collection bobbin 43 retract to release holding of the roll. The operation handle 63 rotates reversely to unload the roll of the residual tape T' from the apparatus body that is placed on the holding block 67.

Upon reaching of the horizontal movable table 65 to its rear end, the air cylinder 27 is turned OFF and the carriage 50 retracts to release connection to the apparatus body. As noted above, loading the master roll 19 and unloading the roll of the residual tape T' from the apparatus body is completed.

According to the apparatus of this embodiment, the collection bobbin 43 is arranged in a vertical line traveling the center of the supply bobbin 18. Consequently, the adhesive tape transport carriage 50 that loads the master roll 19 and unloads the roll of the residual tape T' may be connected in the same position as the collection bobbin 43, thereby allowing replacement of both rolls. In the conventional apparatus in which the supply bobbin and the collection bobbin are arranged in parallel so as to sandwich the chuck table, the master roll of the adhesive tape and the roll of the residual tape are replaced in a different position. Comparing above, therefore, this embodiment may improve working efficiency.

Embodiment 2

In this embodiment, description will be given of adhesive tape joining apparatus that adhesively holds a semiconductor wafer on a ring frame via a supporting adhesive tape (dicing tape.)

The apparatus is formed such that both of the master roll having the strip carrier tape with the precut dicing tape cut in advance into a contour of the ring frame and the master roll of the strip dicing tape may be fed to the bobbin. Like reference numerals are used to identify like elements that are the same as in Embodiment 1 and will not particularly be described.

Figure 14:
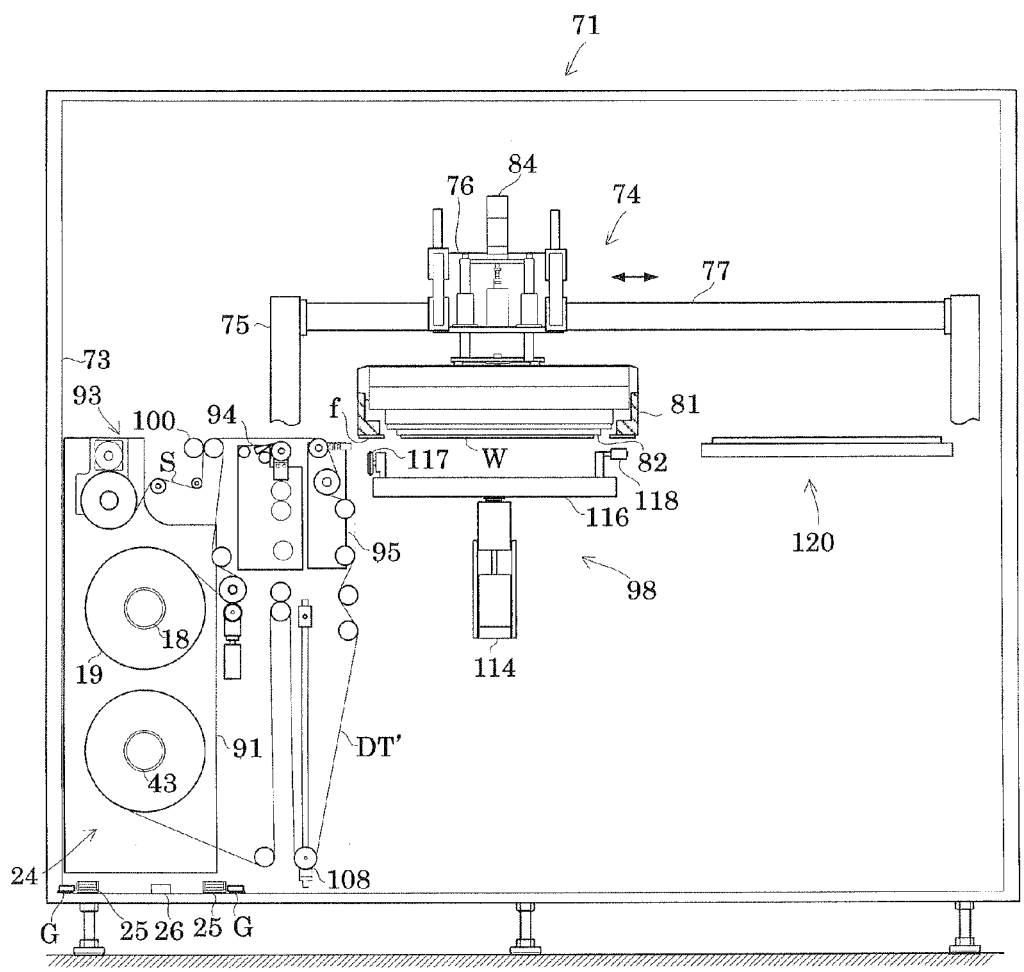
FIG. 14 is a front view of the holding table according to Embodiment 1.

As shown in FIG. 14, the adhesive tape joining apparatus 71 of this embodiment includes a work piece holding mechanism 74, a pair of bobbins 18 and 43, a separator collecting section 93, a joining unit 94, a tape cutting mechanism 98, and a separation unit 95. The work piece holding mechanism 74 may transport an aligned wafer W and ring frame f while suction-holding thereof. The pair of bobbins 18 and 43 sets the master roll 19 of a strip dicing tape DT or a precut dicing tape dt with a separator S, and a roll of the residual tape or the carrier tape CT. The separator collecting section 93 collects the separators S that is separated from the dicing tape DT. The joining unit 94 joins the dicing tape DT or the precut dicing tape dt to the wafer W and the ring frame f. The tape cutting mechanism 98 cuts the dicing tape DT along a contour of the ring frame. The separation unit 95 separates the residual cut tape DT'.

Here, a vertical plate-like support frame 91 is fixedly provided inside an apparatus frame 73. Surrounding mechanisms including the bobbins 18 and 43, the joining unit 94, the separation unit 95, and the tape collecting section 96 are provided in the support frame 91. The tape cutting mechanism 98 is provided so as to move between a standby position rearward of the frame 73 and a cutting operation position at the center of the frame 73.

The work piece holding mechanism 74 is provided on a movable table 76. The movable table 76 moves horizontally and vertically through a support column frame 75 erected from the frame 73.

As shown in FIG. 14, the movable table 76 reciprocates along a pair of horizontal rails 77 in the support column frame 75 through backward and forward rotation of a motor.

Figure 15:
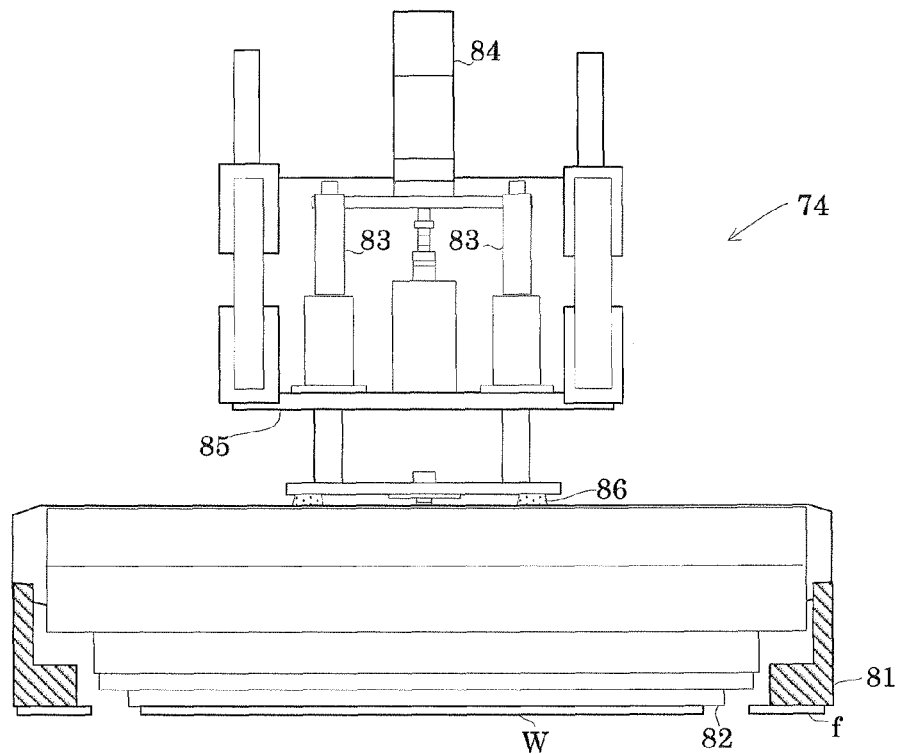
FIG. 15 is an explanatory operation view of the holding table according to Embodiment 1.

As shown in FIG. 15, the movable table 76 has at its lower end a hollow suction frame 81 for suction-holding the ring frame f. The suction frame 81 suction-holds a top face of the ring frame f as one work piece and keeps the ring frame f in a horizontal attitude. A chuck table 82 is provided in a center of the suction frame 81. The chuck table 82 suction-holds a top face of the wafer W subject to a back grinding process and keeps the wafer W in a horizontal attitude.

The movable table 76 has a lifting bracket 85. The lifting bracket 85 is supported so as to move vertically via three guide shafts 83, and driven by an air cylinder 84. The chuck table 82 is supported on the lifting bracket 85 via a buffer 86 made of rubber. Upward and downward movement of the lifting bracket 85 allows the wafer W and the ring frame f to move vertically.

Next, description will be given of a tape supply mechanism 92 and a tape collecting section 96 with reference to FIG. 16.

Specifically, description will be firstly given of a case in this embodiment where the strip dicing tape DT is loaded to the tape supply mechanism 92. Where the precut dicing tape DT is used, mentioned later, there is an inverse relationship between a position of the bobbin for setting the master roll of the strip dicing tape DT and a position of setting the strip dicing tape DT.

The bobbins 18 and 43 have a similar configuration as in Embodiment 1. As shown in FIG. 4, the collection bobbins 18 and 43 have pushers PS arranged at an equal interval along a circumferential surface on a tip end and a proximal end in a longitudinal direction that project and retract therefrom. Both of the bobbins 18 and 43 are applied with appropriate resistance against its rotation in order to prevent the adhesive tape T from being fed out excessively. Here in this embodiment, the bobbin 43 is arranged such that an axis thereof is located vertically below of the axis of the bobbin 18. Moreover, when the master roll 19 is set to the bobbin 18, the master roll 19 is housed inside the frame 73. That is, the bobbins 18 and 43 are arranged vertically in a vertical line.

When the strip dicing tape DT is used in this embodiment, the bobbin 18 is used as the supply bobbin 18.

Figure 16:
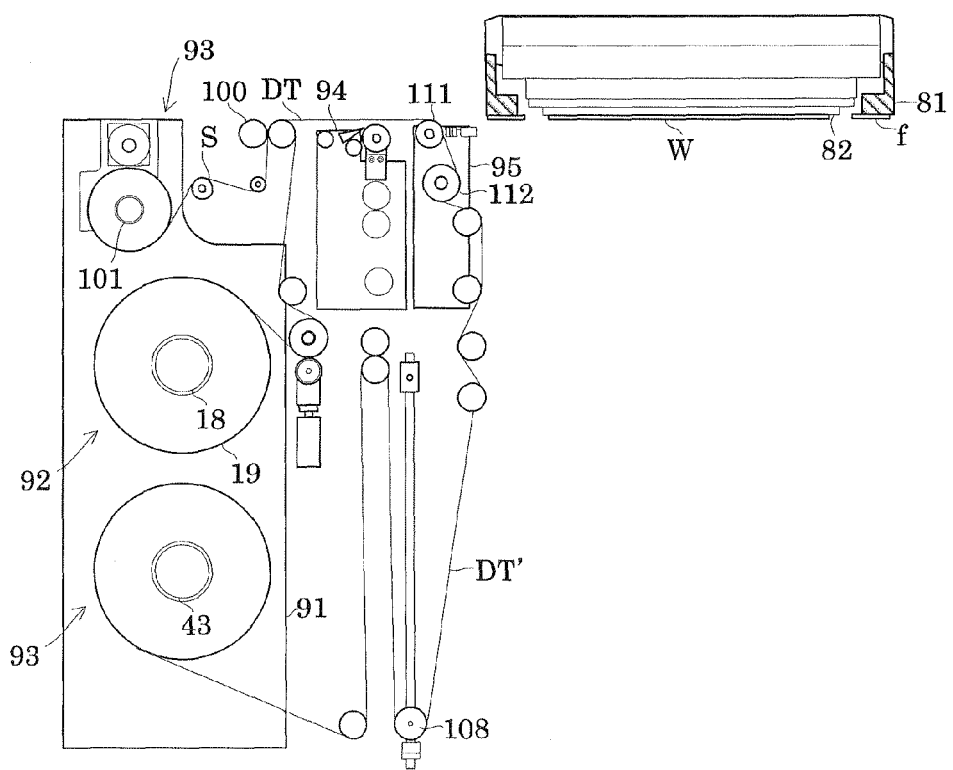
FIGS. 16 to 19 each an operation of joining a strip adhesive tape.

The dicing tape DT is set to the supply bobbin 18, and the dicing tape DT is guided to a pinch roller 100 as shown in FIG. 16. Here, the dicing tape DT has a separator S and is fed out from the tape supply mechanism 92. Then, the separator S is separated from the dicing tape DT and reversely guided downward. Simultaneously, the dicing tape DT with the separator S separated therefrom and an adhesive surface thereof being exposed upward is pulled out horizontally and guided to the separation unit 95. Consequently, the bobbin 18 and the pinch roller 100 serve as the tape supply mechanism in this invention.

When the carrier tape CT is set to the bobbin 43, the carrier tape CT fed out from the master roll 19 is guided through the joining unit 94 to the pinch roller 100 via a dancer roller 108.

The dancer roller 108 pulls out the carrier tape CT with a given pitch so as to supply the precut dicing tape dt to a joining position of the ring frame f on the chuck table 82.

Returning to FIG. 16, the tape collecting section 93 has a collection bobbin 101. The collection bobbin 101 winds up and collects the separator S that is separated from the dicing tape DT and reversely guided downward with the pinch roller 100.

Figure 21:
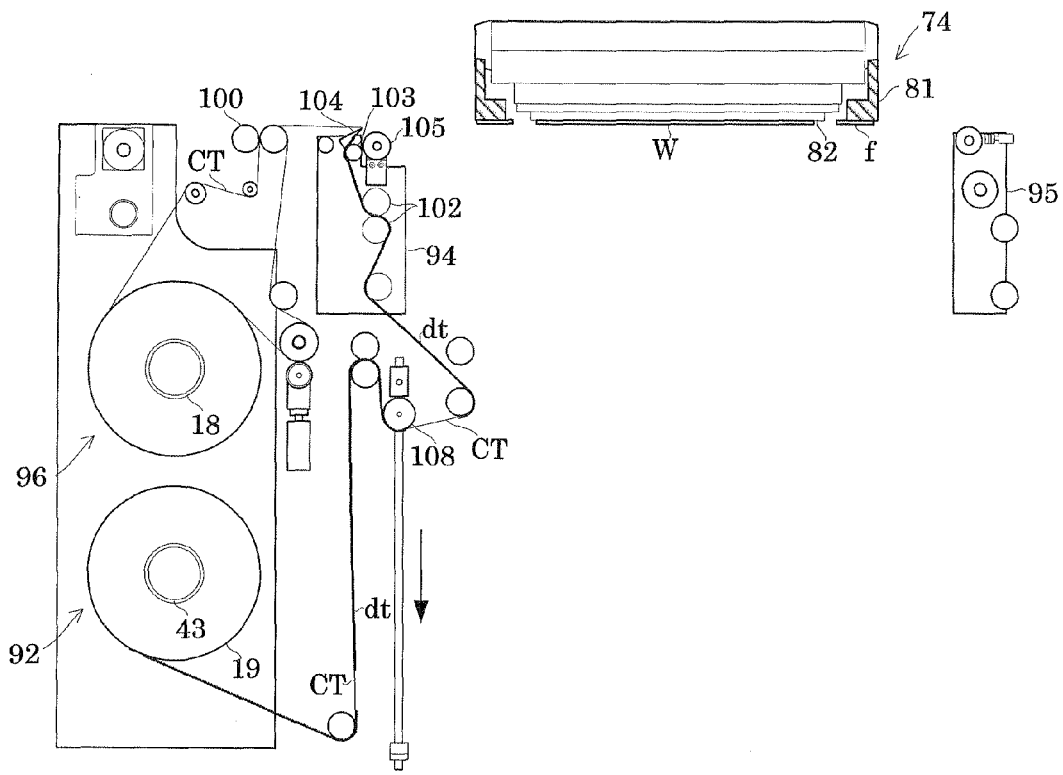
FIGS. 21 to 24 each shows an operation of joining a precut dicing tape.

The joining unit 94 reciprocates horizontally by a drive device, not shown, in a screw feed manner or of belt type. For instance, as shown in FIG. 21, the joining roller includes a guiding pinch roller 102, a guide roller 103, a separation member 104 formed of a thin edge-like plate, and a joining roller 105. The guiding pinch roller 102 receives the carrier tape CT.

Where the dicing tape DT is used, the dicing tape DT is guided to the separation unit 95 while contacting to joining roller 105. Here, the separator S is separated from the dicing tape DT with the pinch roller 100 and the dicing tape DT is folded back and guided horizontally.

Where the precut dicing tape dt is used, the carrier tape CT supplied to the joining unit 94 is guided to the pinch roller 100 through the guiding pinch roller 102, the guide roller 103, and the separation member 104. Here, the carrier tape CT is folded back with the separation member 104. When the carrier tape CT is folded back and guided with an edge at a tip end of the separation member 104, a front end of the precut dicing tape dt is separated from the carrier tape CT. The joining roller 105 presses a non-adhesive surface of the tape dt approximately at the same time as the separated front end approaches the joining position of the ring frame f.

The separation unit 95 reciprocates horizontally by a drive device, not shown, in a screw feed manner. As shown in FIG. 16, the separation unit has a separation roller 111 and a joining roller 112. The separation roller 111 guides the dicing tape DT guided horizontally from the joining unit 94.

The tape cutting mechanism 98 moves backward and forward between a standby position rearward of the apparatus and an operation position in a center line Z of the work piece holding mechanism 74. As shown in FIG. 14, the tape cutting mechanism 98 has a support arm 116 that moves vertically by an air cylinder 114 and turns about the center axis Z. The support arm 116 has at its end a cutter blade 117 in a disk shape. The support arm 116 has at its another end opposed to the cutter blade 117 an idle roller that rolls along the under surface of the work piece.

Similar to the apparatus in Embodiment 1, the tape housing chamber 24 that loads the adhesive tape T to the bobbins 18 and 43 has on the front both sides therebelow a pair of connection mechanisms 25 and a positioning sensor 26, as shown in FIG. 14. The pair of connection mechanisms 25 each engages a pair of connection portions 51 that are arranged in a width direction at a forward end of the carriage 50.

As shown in FIGS. 10 to 11, the connection mechanism 25 has an engagement portion at a tip end of a rod in an air cylinder 27 pivotable about a horizontal axis X rearward of the apparatus body. The engagement portion is formed of a bifurcate frame 28 and an engagement roller 29 supported at a front end thereof so as to freely rotate.

The adhesive tape joining apparatus 71 in this embodiment is configured as above. Next, description will be given of a process to join the strip dicing tape DT or the precut dicing tape dt to the ring frame f and the wafer W.

Description will be given of a step of joining the strip adhesive tape DT with FIGS. 16 to 19.

Upon starting joining, the work piece holding mechanism 74 is in an upper standby position. The ring frame f and the wafer W are supplied to the work piece holding mechanism 74 with a robot arm etc., to be each suction-held in a given position. Here, the wafer W is set such that the under surface thereof slightly projects downward from that of the ring frame f.

As shown in FIG. 16, each of the joining unit 94 and the separation unit 95 returns to its original position on the left end. The dicing tape DT is fed out from the tape supply mechanism 92 with separator S. The dicing tape DT extends over the pinch roller 100 and the separation roller 111 with the separator S separated therefrom.

Figure 17:
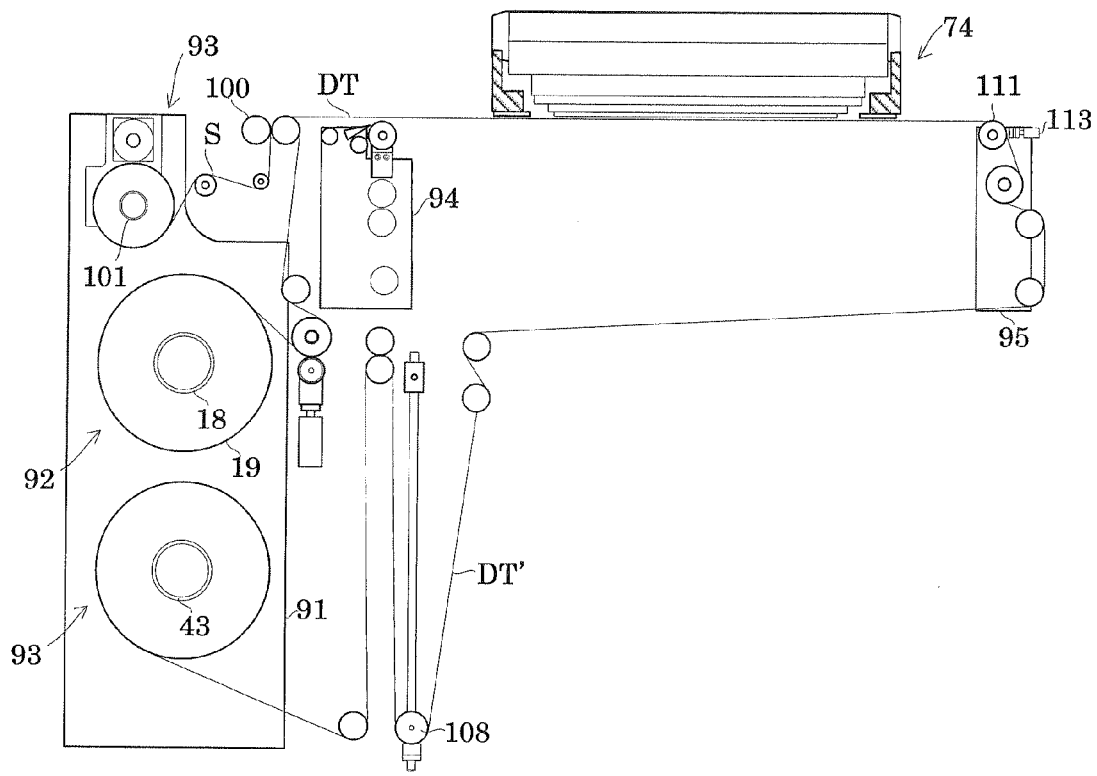

Upon completion of other initial settings, the apparatus operates. Firstly, the separation unit 95 moves forward to the right, as shown in FIG. 17. Upon reaching of the separation unit 95 to a terminal position, a cylinder 113 for tape fixation moves forward to nip the dicing tape DT.

The work piece holding mechanism 74 moves downward to the joining position. Consequently, the under surfaces of the ring frame f and the wafer W approach the adhesive surface of the dicing tape DT directed upward to face to each other.

Figure 18:
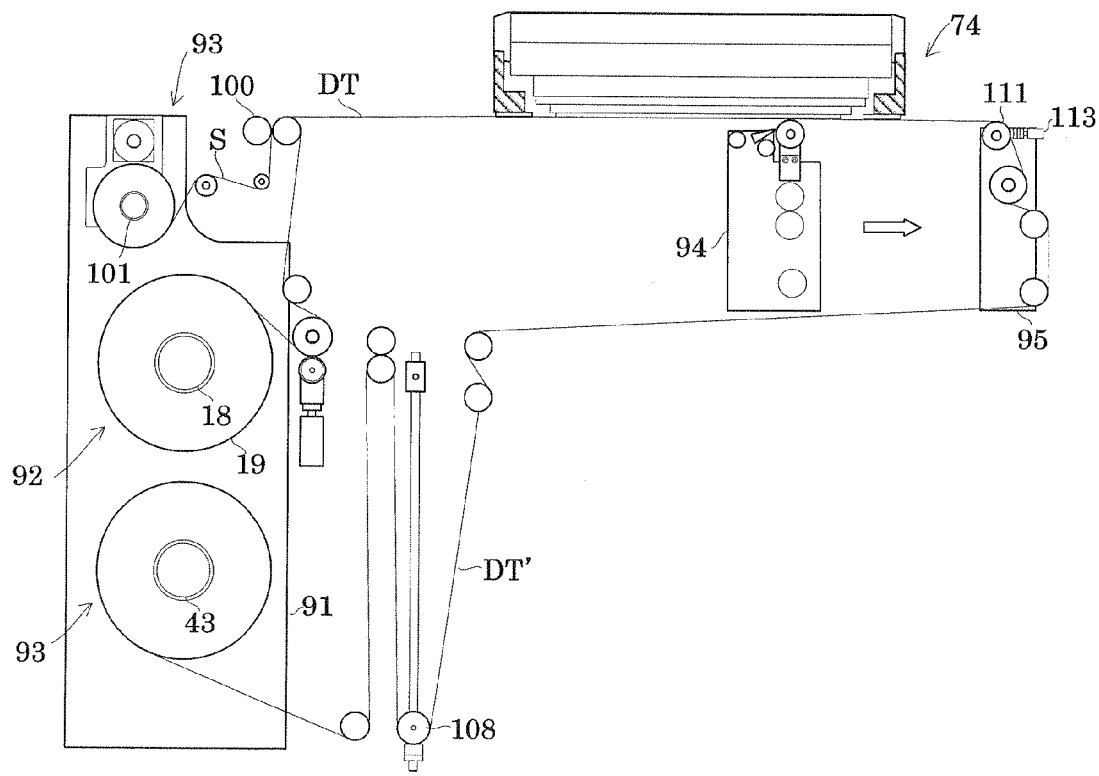

Next, as shown in FIG. 18, the joining unit 94 moves forward to the right. The dicing tape DT is joined to the under surfaces of the ring frame f and the wafer W while pushed upward with the joining roller 105. Here, the chuck table 82 that holds the wafer W is elastically supported via the buffer 86. Consequently, when the wafer W projecting downward from the ring frame f is applied with pressure by the joining roller 105, the buffer 86 is elastically deformed, whereby the wafer W retracts and moves upward such that the under surface of the wafer W is flush with the under surface of the ring frame f. The dicing tape DT is positively pushed against the entire under surface of the wafer W.

Figure 19:
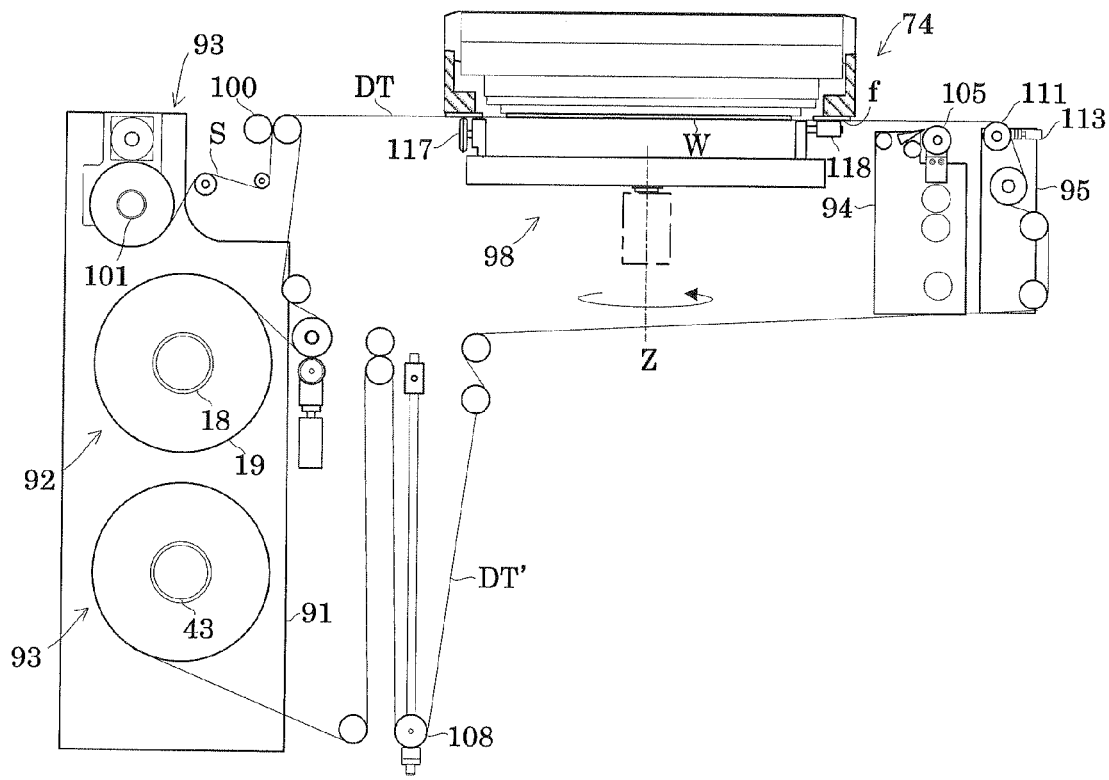

As shown in FIG. 19, the joining unit 94 moves forward to reach the terminal position, and the joining process is completed. Then, the tape cutting mechanism 98 moves to the operation position. Thereafter, the tape cutting mechanism 98 moves upward and turns, whereby the cutter blade 117 turns and travels to cut the dicing tape DT joined to the under surface of the ring frame f in a given diameter. In addition, the idle roller 118 rolls on the cut portion of the dicing tape DT to correct a float in the tape.

Upon completion of cutting the dicing tape DT, the tape cutting mechanism 98 moves downward. The cylinder for tape fixation 113 in the separation unit 95 moves backward to release fixation of the dicing tape DT. Thereafter, as shown in FIG. 16, each of the joining unit 94 and the separation unit 95 moves forward to the left, whereby the residual tape T' of the dicing tape DT after cut out into a circular shape is separated from the ring frame f. Simultaneously, the bobbin 43 in the tape collecting section 96 operates to wind up the residual tape DT'.

Figure 20:
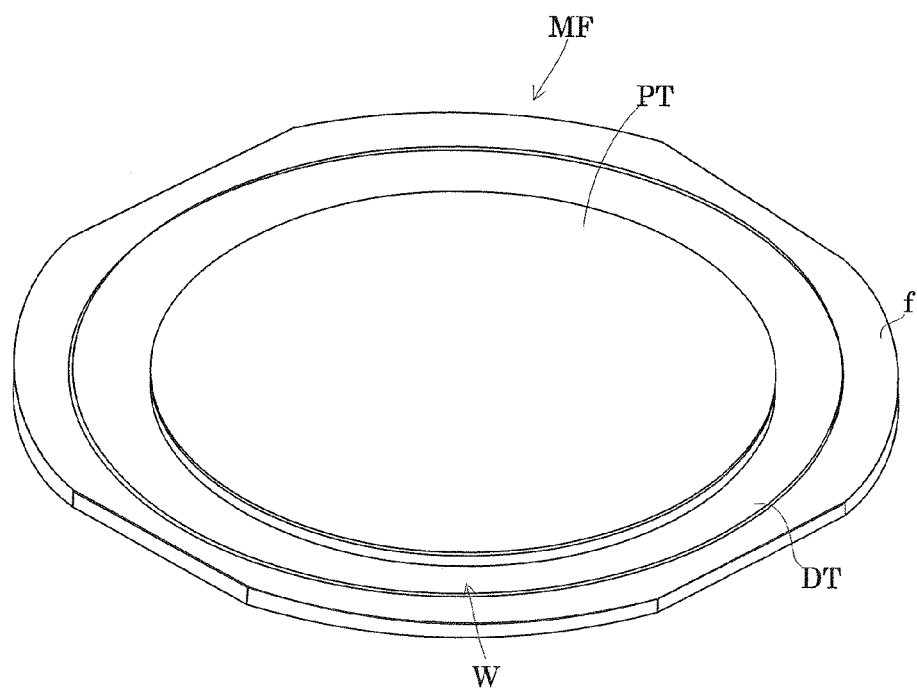
FIG. 20 is a perspective view of the mount frame.

After the cutting process, each of the joining unit 94 and the separation unit 95 moves forward to return to its original position. Then, as shown in FIG. 16, the work piece holding mechanism 74 moves upward. A mount frame MF shown in FIG. 20 into which the ring frame f and the wafer W are integrated via the dicing tape DT cut in the circular shape is unloaded toward a separation unit 120 for a protective tape PT.

As noted above, a series of joining processes is completed using the strip dicing tape DT.

Description will be given of a step of joining the precut dicing tape dt with FIGS. 21 to 26.

Upon starting joining, the work piece holding mechanism 74 is in an upper standby position, as shown in FIG. 21, and suction-holds each of the ring frame f and the wafer W in a given position.

The separation unit 95 not used is fixed in the standby position on the right end. Moreover, the joining unit 94 is on stand by in the initial position set on the left end. The tape cutting mechanism 98 not used is fixed in the standby position rearward of the apparatus.

The dancer roller 108 pulls out the carrier tape CT from the bobbin 43 and supplies the carrier tape CT to the joining unit 94. Specifically, the carrier tape CT is wound up and guided on a given path, and fed out forward to be guided to the tape collection section 96 through the pinch roller 100.

Upon completion of other initial settings, the work piece holding mechanism 74 moves downward. Consequently, the under surface of the ring frame f is aligned to the operation position to face and approach to the joining roller 105.

Figure 22:
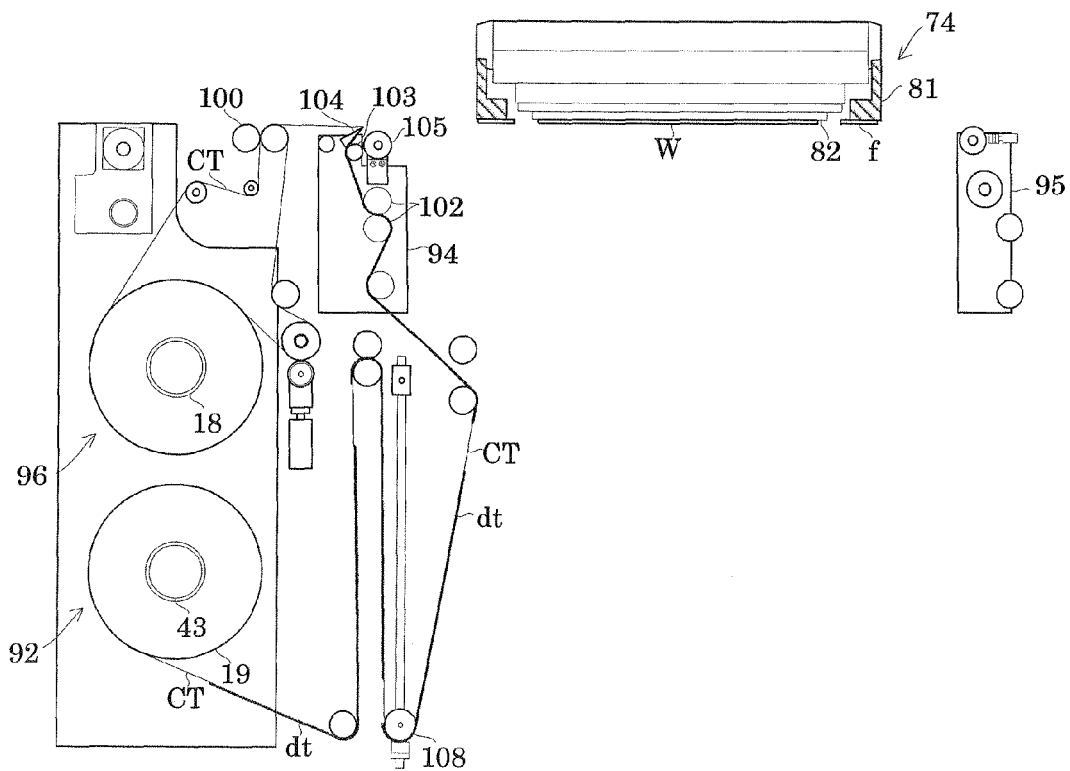

As shown in FIG. 22, the dancer roller 108 unloads the carrier tape CT from the master roll 19 with a given pitch.

Figure 23:
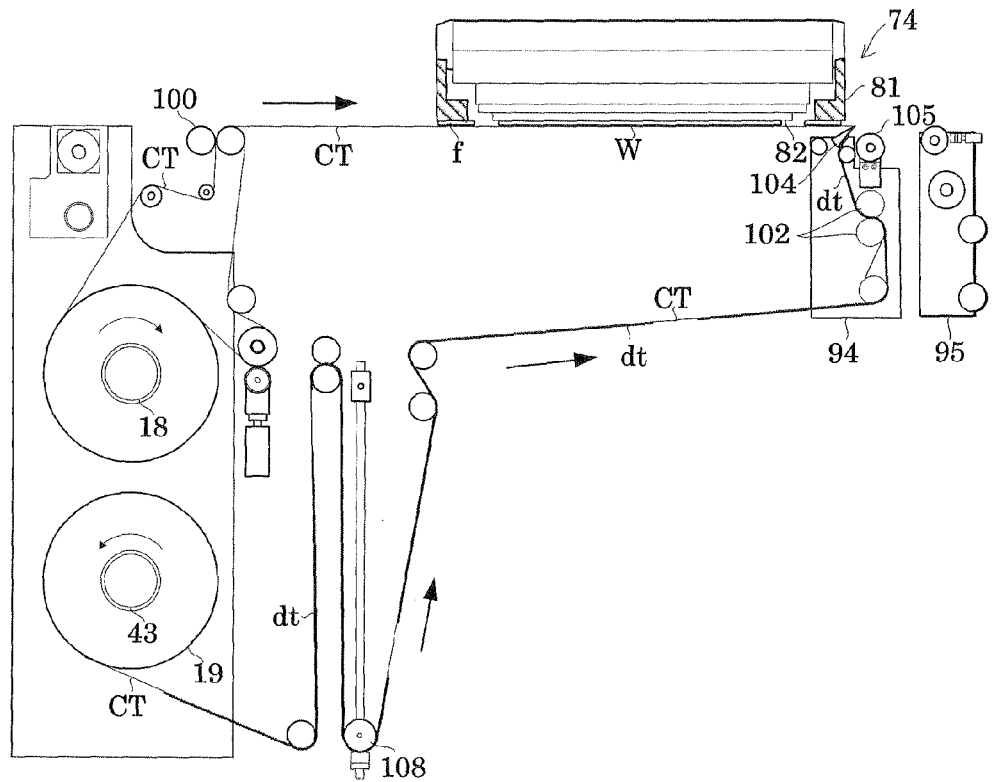

As shown in FIG. 23, the joining unit 94 moves forward to the right end. Here, the pinch roller 100 reversely rotates to unload the used carrier tape CT from the bobbin 18. Simultaneously, the pinch roller 100 drives to further unload the carrier tape CT from the bobbin 43 toward the joining unit 94 while fixing the dancer roller 108. The joining unit 94 in the predetermined terminal position moves forward to the initial position.

Figure 25:
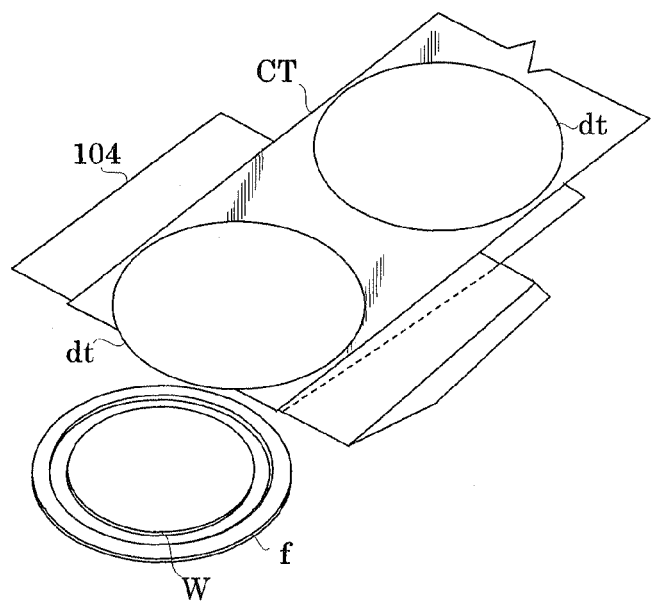
FIG. 25 is an enlarged view of a principal portion showing the operation of joining the precut dicing tape.

When the joining unit 94 moves, the pinch roller 100 and the bobbin 43 drive accordingly. That is, the traveling carrier tape CT is wounded and collected to the bobbin 43. Here, as shown in FIG. 25, the precut dicing tape dt joined and held on the carrier tape CT is separated from the carrier tape CT with the separation member 104. The tip end of the precut dicing tape dt is detected with an optical sensor etc., during this step, to stop traveling of the tape.

Under a state where the tape stops traveling, the front end of the precut dicing tape dt is separated from the carrier tape CT with the separation member 104. The precut dicing tape dt approaches and faces to the joining position of the ring frame f with the adhesive surface thereof directed upward. Here, a joining start position of the ring frame is directly above the joining roller 105.

Figure 24:
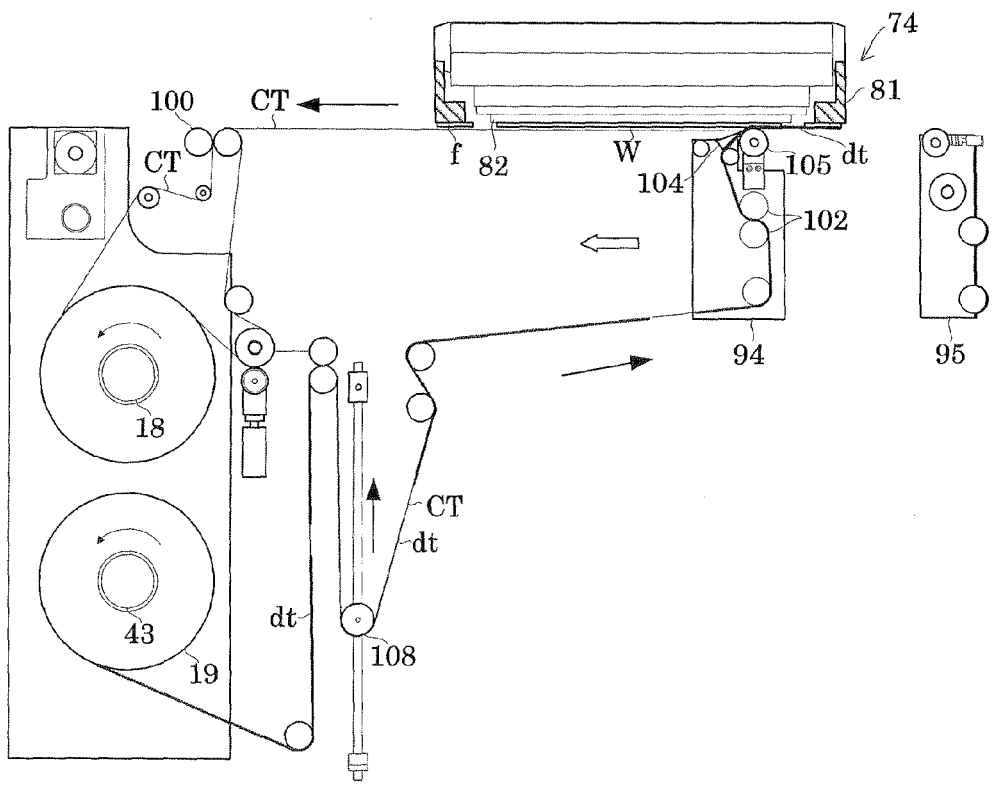
Figure 26:
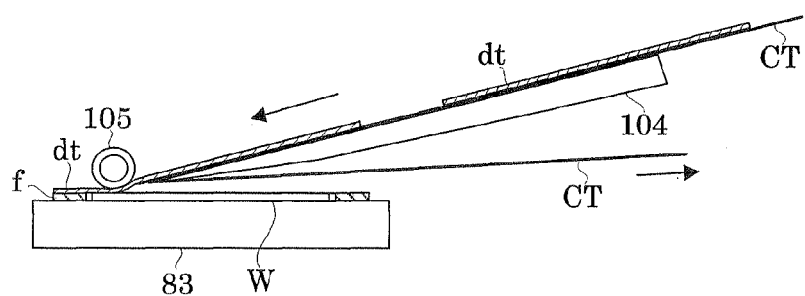
FIG. 26 is a side view showing the operation of joining the precut dicing tape.

The joining roller 105 in the joining start position moves upward to press the front end of the precut dicing tape dt to the under surface of the ring frame f. Thereafter, the joining unit 94 moves forward to the left. Here, the pinch roller 100 winds up at a speed synchronized to a traveling speed of the joining unit 94. The dancer roller 108 also drives in synchronization with the pinch roller 100 to load the stored carrier tape CT to the joining unit 94. As shown in FIGS. 24 and 26, the precut dicing tape dt separated from the carrier tape CT with the edge of the separation member 104 is successively joined to the ring frame f and the wafer W with the joining roller 105. The joining unit 94 drives so as to generate a weak back tension to both of the bobbins 18 and 43 in performing the joining process.

The joining unit 94 moves forward to return to its original position. Then, the work piece holding mechanism 74 moves upward. The mount frame MF into which the ring frame f and the wafer W are integrated via the precut dicing tape dt is unloaded to the separation unit 120 for preparing loading of a new work piece. As noted above, a series of joining processes is completed using the precut dicing tape dt.

With the foregoing adhesive tape joining apparatus 71, the strip dicing tape DT and the precut dicing tape dt may be joined to the ring frame f and the wafer W using one piece of apparatus. Accordingly, there is no need to individually install apparatus in accordance with types of the tape, which realizing reduction in equipment cost and install space.

Moreover, the collection bobbins 18 and 43 are arranged vertically regardless of types of the adhesive tape. Consequently, the adhesive tape transport carriage 50 has the same connection position to the apparatus body between when loading the master roll 19 and when unloading the roll of the residual tape T' and the roll of the carrier tape CT, thereby allowing replacement of both rolls. In the conventional apparatus in which the supply bobbin and the collection bobbin are arranged in parallel so as to sandwich the chuck table, the master roll of the adhesive tape and the roll of the residual tape are replaced in a different position. Comparing above, therefore, this embodiment may improve working efficiency.

This invention may be implemented in the following modified forms.

The adhesive tape transport carriage 50 in each of the foregoing embodiments moves the movable table 60 and the horizontal movable tables 65 through a manual handle operation. The adhesive tape transport carriage 50 may move horizontally and vertically the movable table 60 and the horizontal movable table 65 with a drive such as a motor.

The adhesive tape transport carriage 50 in each of the foregoing embodiments has the holding table 62 longer than the carriage frame 52 that is formed such that the front end of the holding table 62 pushes out from the tape housing chamber 24. The holding table 62 may have a length not longer than the length of the carriage frame 52.

Figure 27:
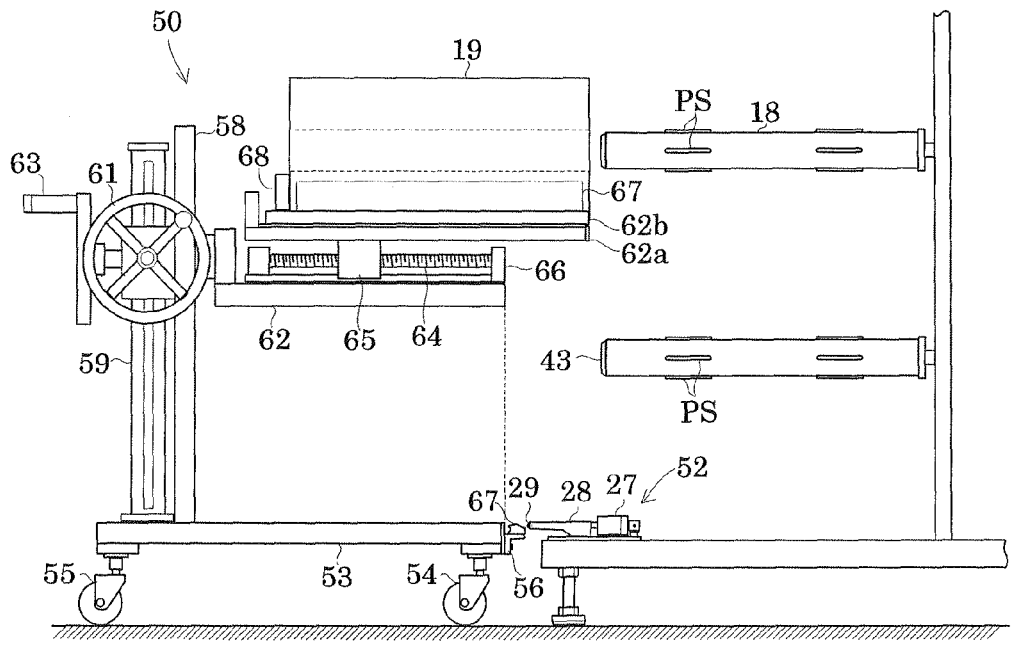
FIG. 27 is a side view of an adhesive tape transport carriage in another embodiment.
Figure 28:
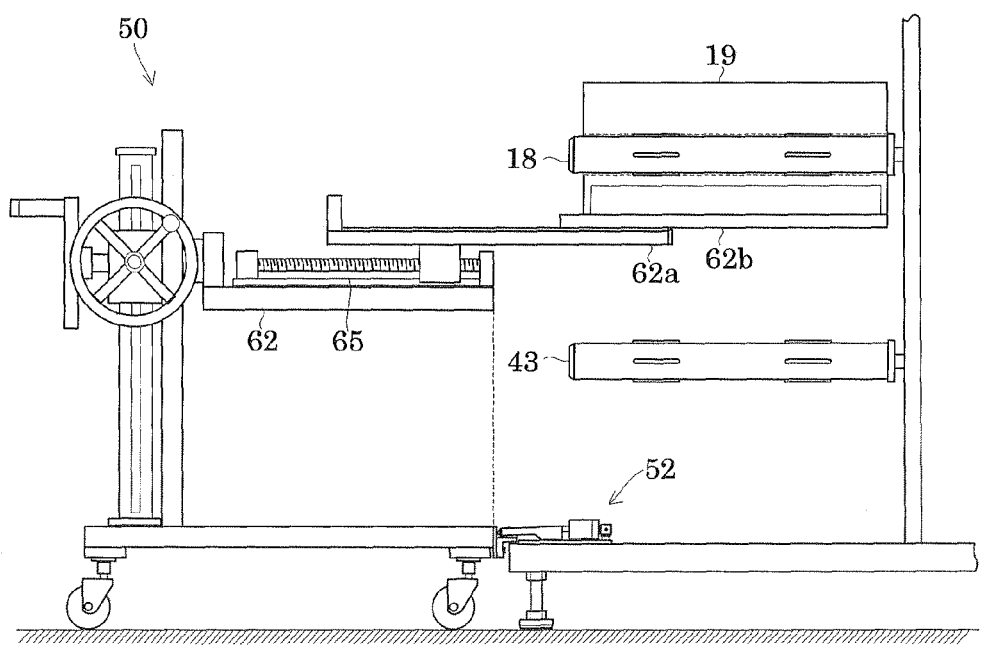
FIG. 28 is an explanatory operation view of the adhesive tape transport carriage in another embodiment.

For instance, as shown in FIGS. 27 and 28, this configuration has a holding table 62 with holding tables 62a and 62b of two table structure. The holding table 62 slidingly moves along a rail on the holding table 62a. That is, the holding table 62 is capable of expanding and contracting.

Moreover, in this configuration, loading the master roll to the supply bobbin 18 and unloading the roll of the residual tape T from the collection bobbin 43 may be performed while the adhesive tape transport carriage 50 is connected to the apparatus body.

In the apparatus of Embodiment 2, the work piece holding mechanism 74 is arranged above the joining unit 94 and the separation unit 95 for performing a joining process to the under surface of the wafer W. The reverse configuration may be adopted. That is, the joining unit 94, etc., and the work piece holding mechanism 74 may be replaced in its position upside down. In addition, the work piece holding mechanism 74 may move vertically with the rear face of the wafer W directed upward to join the dicing tape DT. Here in this configuration, both of the bobbins 18 and 43 are also arranged vertically in a vertical line.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. Adhesive tape joining apparatus that joins an adhesive tape to a semiconductor wafer, comprising:
   a holding table that holds the semiconductor wafer;
   a tape supply mechanism that supplies the strip adhesive tape wound about an master roll to the semiconductor wafer;
   a tape joining mechanism that joins the adhesive tape to the semiconductor wafer;
   a tape cutting mechanism that cuts the adhesive tape along a contour of the semiconductor wafer;
   a tape collecting section having a winding shaft that is aligned with a center of the master roll set in the tape supply mechanism in a vertical direction and that winds up and collects a residual cut tape into a roll shape; and
   a connection mechanism that guides to a tape set position an adhesive tape transport carriage that loads the master roll to the tape supply mechanism and unloads the roll of the residual cut tape from the tape collecting section, and positions the adhesive tape transport carriage for connection thereof,
   the adhesive tape transport carriage comprising:
   a caster on a bottom face of a carriage frame;
   a lifting movable table that lifts along an axis that is erected on the carriage frame; and
   a holding table that mounts and holds the roll and moves horizontally with respect to the carriage frame.

2. The adhesive tape joining apparatus according to claim 1, wherein
   the holding table in the adhesive tape transport carriage is formed so as to be capable of expanding and contracting, and
   loading of the master roll and collecting of the residual tape is performed while the adhesive tape transport carriage is connected to the adhesive tape joining apparatus.

3. The adhesive tape joining apparatus according to claim 1, wherein
   the connection mechanism is engaged with an engagement portion at a forward end of the adhesive tape transport carriage so as to guide the adhesive tape transport carriage.

4. The adhesive tape joining apparatus according to claim 1, further comprising:
   a sensor that detects a connection state of the adhesive tape transport carriage.

5. Adhesive tape joining apparatus that joins an adhesive tape to a semiconductor water, comprising:
   a holding table that holds the semiconductor wafer;
   a tape supply mechanism supplies from a master roll to the semiconductor wafer a strip carrier tape with a precut adhesive tape cut in advance in the semiconductor shape being joined and held with a given pitch;
   a tape joining mechanism that joins the adhesive tape to the semiconductor wafer while separating the adhesive tape by folding back the carrier tape with an edge member;
   a tape collecting section having a winding shaft that is aligned with a center of the master roll set in the tape supply mechanism in a vertical direction and that winds up and collects the carrier tape separated with a separation member into a roll shape; and
   a connection mechanism that guides to a tape set position an adhesive tape transport carriage that loads the master roll to the tape supply mechanism and unloads the roll of the carrier tape from the tape collecting section, and positions the adhesive tape transport carriage for connection thereof,
   the adhesive tare transport carriage comprising:
   a caster on a bottom face of a carriage frame;
   a lifting movable table that lifts alone an axis that is erected on the carriage frame; and
   a holding table that mounts and holds the roll and moves horizontally with respect to the carriage frame.

6. The adhesive tape joining apparatus according to claim 5, wherein
   the holding table in the adhesive tape transport carriage is formed so as to be capable of expanding and contracting, and
   loading of the master roll and collecting of the residual tape is performed while the adhesive tape transport carriage is connected to the adhesive tape joining apparatus.

7. The adhesive tape joining apparatus according to claim 5, wherein
   the connection mechanism is engaged with an engagement portion at a forward end of the adhesive tape transport carriage so as to guide the adhesive tape transport carriage.

8. The adhesive tape joining apparatus according to claim 5, further comprising:
   a sensor that detects a connection state of the adhesive tape transport carriage.

9. Adhesive tape joining apparatus that joins a supporting adhesive tape to a ring frame and a semiconductor water for integration therewith, comprising:
   a work piece holding mechanism that holds each of the ring frame and the semiconductor wafer in a given attitude;
   a tape supply mechanism that supplies a carrier tape with a precut adhesive tape cut in advance in the ring frame being joined and held or a strip adhesive tape to a rear face of the ring frame that is held on the work piece holding mechanism;
   a tape joining unit that joins the adhesive tape to the ring frame and the semiconductor wafer held on the work piece holding mechanism by a joining roller that rolls while pressing the precut adhesive tape that is folded back with the separation member and fed out from the carrier tape or the strip adhesive tape;
   a tape cutting mechanism that cuts the strip adhesive tape along a contour of the ring frame;
   a tape collecting section having a winding shaft that is aligned with a center of the master roll set in the tape supply mechanism in a vertical direction and that winds up and collects the residual tape subject to a cutting process or the carrier tape and
   a connection mechanism that guides to a tape set position an adhesive tape transport carriage that loads the master roll to the tape supply mechanism and unloads the roll of the residual tape or the carrier tape from the tape collecting section, and positions the adhesive tape transport carriage for connection thereof,
   the adhesive tape transport carriage comprising:
   a caster on a bottom face of a carriage frame;
   a lifting movable table that lifts along an axis that is erected on the carriage frame; and
   a holding table that mounts and holds the roll and moves horizontally with respect to the carriage frame.

10. The adhesive tape joining apparatus according to claim 9, wherein
   the holding table in the adhesive tape transport carriage is formed so as to be capable of expanding and contracting, and
   loading of the master roll and collecting of the residual tape is performed while the adhesive tape transport carriage is connected to the adhesive tape joining apparatus.

11. The adhesive tape joining apparatus according to claim 9, wherein
   the connection mechanism is engaged with an engagement portion at a forward end of the adhesive tape transport carriage so as to guide the adhesive tape transport carriage.

12. The adhesive tape joining apparatus according to claim 9, further comprising:
   a sensor that detects a connection state of the adhesive tape transport carriage.

* * * * *